(12) United States Patent
Kito et al.

(10) Patent No.: US 7,952,136 B2
(45) Date of Patent: May 31, 2011

(54) NONVOLATILE SEMICONDUCTOR STORAGE APPARATUS AND METHOD FOR MANUFACTURING THE SAME

(75) Inventors: Masaru Kito, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 638 days.

(21) Appl. No.: 11/874,004

(22) Filed: Oct. 17, 2007

(65) Prior Publication Data

US 2008/0099819 A1   May 1, 2008

(30) Foreign Application Priority Data

Oct. 17, 2006   (JP) ................................ P2006-283117

(51) Int. Cl.
*H01L 29/788* (2006.01)
(52) U.S. Cl. .................................... 257/326; 257/E29.3
(58) Field of Classification Search .................. 257/331, 257/314, 315, 316, 319, 324, 326, E29.309, 257/E21.409, E21.422, E29.3
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 6,727,544 B2 | 4/2004 | Endoh et al. | |
| 7,135,726 B2 | 11/2006 | Endoh et al. | |
| 7,382,018 B2 | 6/2008 | Kim et al. | |
| 2004/0262681 A1 | 12/2004 | Masuoka et al. | |
| 2005/0063237 A1 | 3/2005 | Masuoka et al. | |
| 2007/0252201 A1* | 11/2007 | Kito et al. ...................... | 257/331 |

FOREIGN PATENT DOCUMENTS

| | | |
|---|---|---|
| JP | 2003-78044 | 3/2003 |
| JP | 2004-356314 | 12/2004 |
| JP | 2005-311300 | 11/2005 |
| KR | 2002-0076199 | 10/2002 |
| KR | 10-2006-0044686 | 5/2006 |
| KR | 10-2006-0089547 | 8/2006 |

OTHER PUBLICATIONS

U.S. Appl. No. 11/898,746, filed Sep. 14, 2007, Kidoh, et al.
U.S. Appl. No. 11/889,863, filed Aug. 17, 2007, Kito, et al.
U.S. Appl. No. 11/955,900, filed Dec. 13, 2007, Katsumata, et al.
U.S. Appl. No. 12/021,003, filed Jan. 28, 2008, Enda et al.
U.S. Appl. No. 12/108,783, filed Apr. 24, 2008, Kamigaichi, et al.
U.S. Appl. No. 12/140,734, filed Jun. 17, 2008, Kito, et al.
Tetsuo Endoh, et al., "Novel Ultrahigh-Density Flash Memory With a Stacked-Surrounding Gate Transistor (S-SGT) Structured Cell", IEEE Transactions on Electron Devices, vol. 50, No. 4, Apr. 2003, pp. 945-951.
U.S. Appl. No. 12/556,242, filed Sep. 9, 2009, Fukuzumi, et al.

* cited by examiner

*Primary Examiner* — Thomas L Dickey
*Assistant Examiner* — Fazli Erdem
(74) *Attorney, Agent, or Firm* — Oblon, Spivak, McClelland, Maier & Neustadt, L.L.P.

(57) ABSTRACT

According to an aspect of the present invention, there is provided a nonvolatile semiconductor storage apparatus including: a substrate; a columnar semiconductor disposed perpendicular to the substrate; a charge storage laminated film disposed around the columnar semiconductor; a first conductor layer that is in contact with the charge storage laminated film and that has a first end portion having a first end face; a second conductor layer that is in contact with the charge storage laminated film, that is separated from the first conductor layer and that has a second end portion having a second end face; a first contact plug disposed on the first end face; and a second contact plug disposed on the second end face.

10 Claims, 35 Drawing Sheets

NONVOLATILE SEMICONDUCTOR STORAGE APPARATUS AND METHOD FOR MANUFACTURING THE SAME

CROSS-REFERENCE TO RELATED APPLICATIONS

The entire disclosure of Japanese Patent Application No. 2006-283117 filed on Oct. 17, 2006 including specification, claims, drawings and abstract is incorporated herein by reference in its entirety.

BACKGROUND OF THE INVENTION

1. Field of the Invention

An aspect of the present invention relates to a semiconductor storage apparatus capable of electrically rewriting data, and more particularly to a nonvolatile semiconductor storage apparatus among semiconductor storage devices.

2. Description of the Related Art

A surge has a risen in a demand for a compact, large-capacity nonvolatile semiconductor storage device, and NAND flash memory which can be expected to realize higher integration and greater capacity has gained attention. Under a common manufacturing method, difficulty has become encountered in miniaturizing a design rule for microprocessing a trace pattern, or the like.

For these reasons, in order to enhance the integration of memory, a plurality of semiconductor storage devices including three-dimensionally arranged memory cells have recently been proposed (for example, refer to JP-2003-078044-A, U.S. Pat. No. 5,599,724, U.S. Pat. No. 5,707,885 and Masuoka et al., "Novel Ultrahigh-Density Flash Memory With a Stacked-Surrounding Gate Transistor (S-SGT) Structured Cell," IEEE TRANSACTIONS ON ELECTRONIC DEVICES, VOL. 50, NO. 4, pp 945-951, April 2003).

In many related-art semiconductor storage devices including three-dimensionally arranged memory cells, memory cells must be subjected to processing pertaining to a plurality of photo engraving processes (hereinafter abbreviated as "PEP," wherein patterning is performed through processes, such as a lithography process and an etching process, employing a so-called photoresist) on a per-layer basis. A PEP which is performed at a minimum line width of the design rule is taken as a "critical PEP," and a photo engraving process which is performed at a line width greater than the minimum line width of the design rule is taken as "rough PEP." In a related-art semiconductor storage device in which memory cells are arranged in a three-dimensional pattern, three critical PEPs or more are required for one layer of memory cell. Moreover, in many semiconductor storage devices, memory cells are simply stacked one on top of the other, which unavoidably results in an increase in cost attributable to three-dimensional integration of memory cells.

Additionally, in a case where the memory cells are arranged in a three-dimensional pattern, a cost reduction effect can be enhanced if all via holes for a plurality of word-line electrode layers (such as, a polysilicon layers, an amorphous silicon layers or metal layers) of the memory cells can be formed in one process.

SUMMARY OF THE INVENTION

According to an aspect of the present invention, there is provided a nonvolatile semiconductor storage apparatus including: a substrate; an insulating layer disposed on the substrate; a columnar semiconductor disposed perpendicular to the substrate; a laminated film including: a first insulating film disposed around the columnar semiconductor, a charge storage film disposed around the first insulating film, and a second insulating film disposed around the charge storage film; a first conductor layer that is disposed on the insulating layer and that is in contact with the laminated film; a first interlayer insulating layer disposed on the first conductor layer; a second conductor layer that is disposed on the first interlayer insulating layer and that is in contact with the laminated film; a first contact plug that is connected to the first conductor layer; and a second contact plug that is connected to the second conductor layer; wherein the first conductor layer includes a first end portion that is bent upwardly; wherein the second conductor layer includes a second end portion that is bent upwardly; wherein the first end portion includes a first end face; wherein the second end portion includes a second end face; wherein the first contact plug is disposed on the first end face; and wherein the second contact plug is disposed on the second end face.

According to another aspect of the present invention, there is provided a method for manufacturing a nonvolatile semiconductor storage apparatus, including: performing an opening formation process, including: depositing an insulating film on a substrate, and forming a concave portion and a convex portion in the insulating film; performing a deposition process, including: depositing a first conductor film along the concave portion, a sidewall of the concave portion and the convex portion, and depositing a first interlayer insulating film on the first conductor film; performing a planarization process, including: removing the first interlayer insulating film over the convex portion, and removing the first conductor film over the convex portion; and forming a contact plug on an end face of the first conductor film exposed through the planarization process.

According to still another aspect of the present invention, there is provided a nonvolatile semiconductor storage apparatus including: a substrate; a columnar semiconductor formed perpendicular to the substrate; a charge storage laminated film formed around the columnar semiconductor; a first conductor layer that is in contact with the charge storage laminated film; and a second conductor layer that is separated from the first conductor layer and that is in contact with the charge storage laminated film; wherein an end face of the first conductor layer and an end face of the second conductor layer are formed in a common plane that is parallel with the substrate.

BRIEF DESCRIPTION OF THE DRAWINGS

Embodiment may be described in detail with reference to the accompanying drawings, in which.

DETAILED DESCRIPTION OF THE INVENTION

Best Modes for Implementing the Invention

Figure 1:
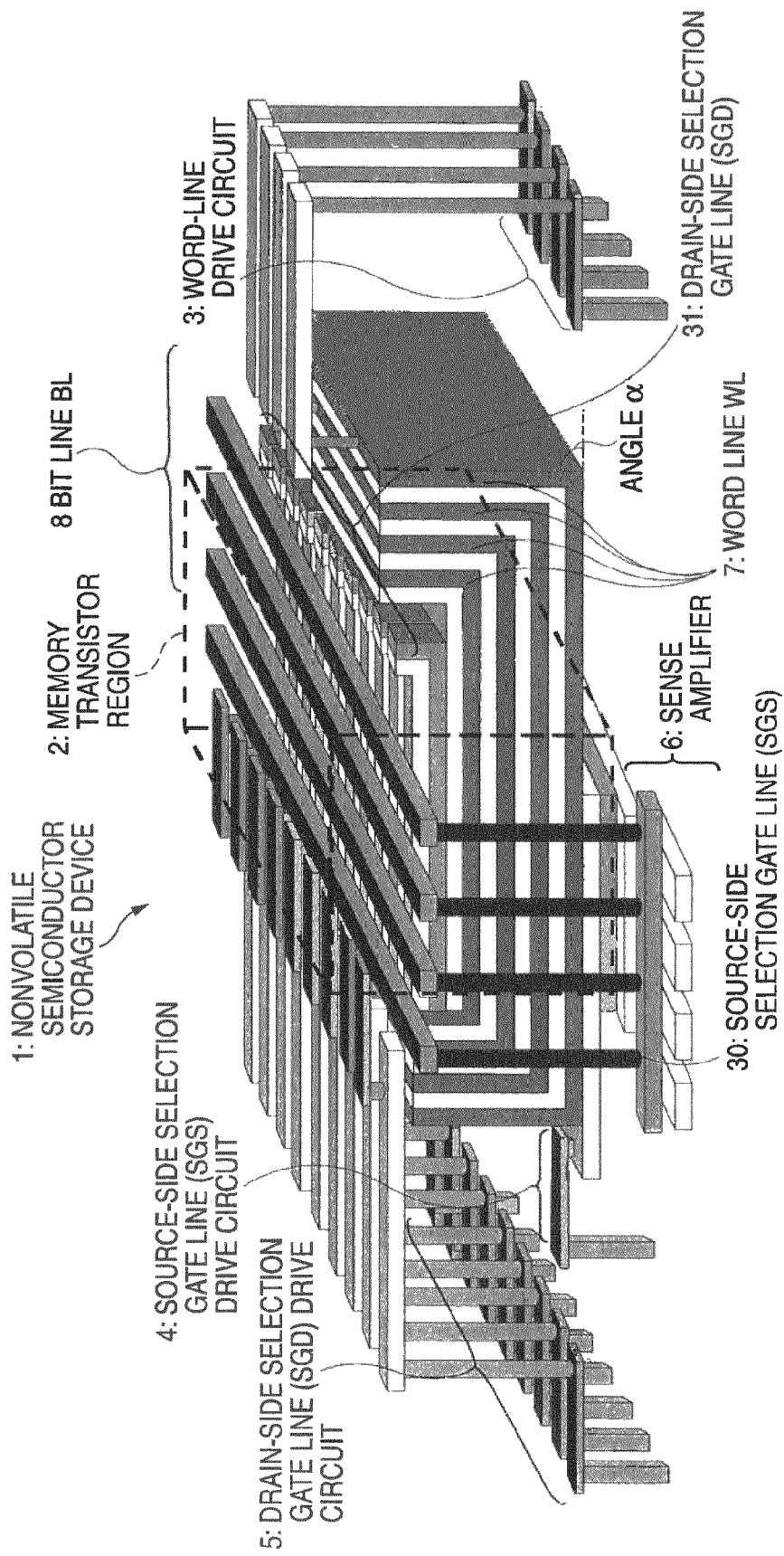
FIG. 1 is a schematic diagram of a nonvolatile semiconductor storage device 1 of a first embodiment.

Nonvolatile semiconductor storage devices of embodiments of the present invention and a method for manufacturing the same will be described hereunder. The present invention is not limited to the embodiments provided below. In the respective embodiments, like constituent elements are assigned like reference numerals, and it may be the case where their repeated explanations are not provided.

First Embodiment

FIG. 1 shows a schematic diagram of a nonvolatile semiconductor storage device 1 of a first embodiment. The nonvolatile semiconductor storage device 1 of the first embodiment has a memory transistor region 2; word-line drive circuits 3; source-side selection gate line (SGS) drive circuits 4; drain-side selection gate line (SGD) drive circuits 5; sense amplifiers 6; word lines WL 7; bit lines BL 8; source-side selection gate lines SGS 30; drain-side selection gate lines SGD 31; and the like. As shown in FIG. 1, in the nonvolatile semiconductor storage device 1 of the first embodiment, memory transistors constituting the memory transistor region 2 are collectively formed by means of stacking a plurality of semiconductor layers one on top of the other. Moreover, as shown in FIG. 1, the word lines WL7 in each layer spread two-dimensionally in the memory transistor region 2. Ends of the word lines WL7 on at least one end in a direction orthogonal to the bit lines 8 are bent upwardly with respect to a substrate and planarized by means of CMP, or the like. Thus, the ends have flat end faces, respectively. Contacts for connecting the word lines WL7 to the word-line drive circuit 3 are collectively formed on exposed end faces of the respective word lines L7 in a single process. Consequently, processing of the contacts is facilitated.

Figure 2:
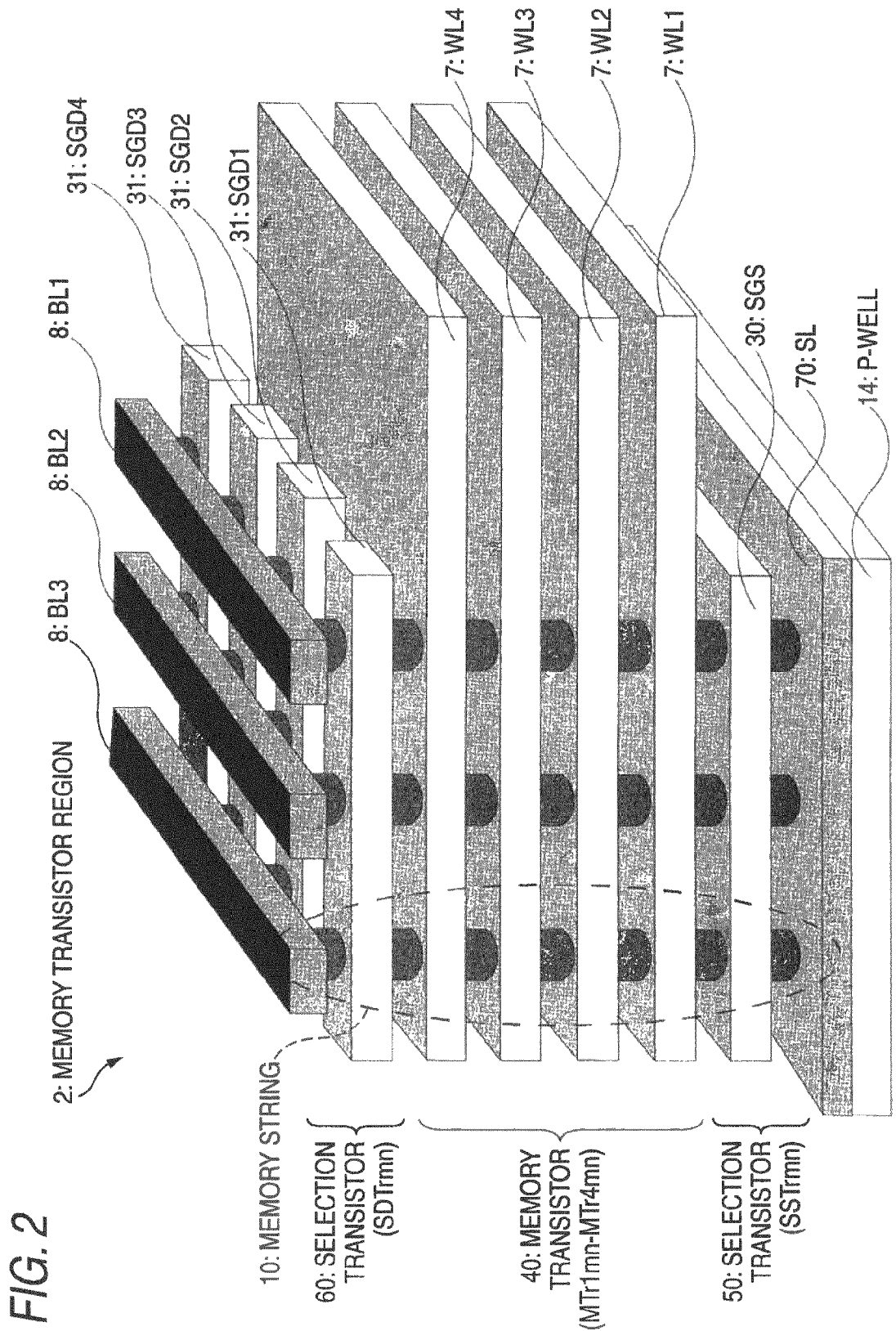
FIG. 2 is a schematic diagram of a portion of a memory transistor region 2 of the nonvolatile semiconductor storage device 1 of the first embodiment.

FIG. 2 is a schematic diagram of a portion of the memory transistor region 2 of the nonvolatile semiconductor storage device 1 of the first embodiment. In the present embodiment, the memory transistor region 2 has m×n ("m" and "n" denote natural numbers) memory stings 10, each of which includes memory transistors (MTr1mn to MTr4nm) 40, a selection transistor SSTrmn 50, and a SDTrmn 60. FIG. 2 shows an example memory transistor region 2 achieved in the case of m=3 and n=4.

The word lines WL 1 to WL 4 (7) connected to gates of the memory transistors (MTr1mn to MTr4nm) 40 of each memory string 10 are formed commonly from a single electric conductor layer. As shown in FIGS. 1 and 2, the word lines WL 1 to WL 4 (7) of the nonvolatile semiconductor storage device 1 of the first embodiment spread two-dimensionally and assume a flat planar structure. Each of the word lines WL1 to WL4 (7) has a planar structure essentially perpendicular to the memory string 10. The source-side selection gate lines SGS 30 that drives the source-side selection transistor SSTrmn 50 can be operationally brought into a common electric potential on each layer at all times. Therefore, in the present embodiment, the source-side selection gate line SGS 30 adopts a planar structure. However, the shape of the SGS 30 is not limited to the planar structure but may also assume a structure consisting of mutually separated and insulated interconnects. The drain-side selection gate line SGD 31 may also assume a planar structure or a structure consisting of mutually separated and insulated interconnects.

In the semiconductor substrate, an n+ region (not shown) is formed on a P-well region 14. Each of the memory strings 10 has a columnar semiconductor on the n+ region. The respective memory strings 10 are arranged in a matrix pattern on the semiconductor substrate. The columnar semiconductors may also assume a columnar shape or a prismatic shape. The columnar semiconductor includes a columnar semiconductor of a stepped structure including a columnar semiconductor symmetrical about a center line and a columnar semiconductor of another center line stacked thereon, as well as including a structure symmetrical about a single center line.

Figure 3:
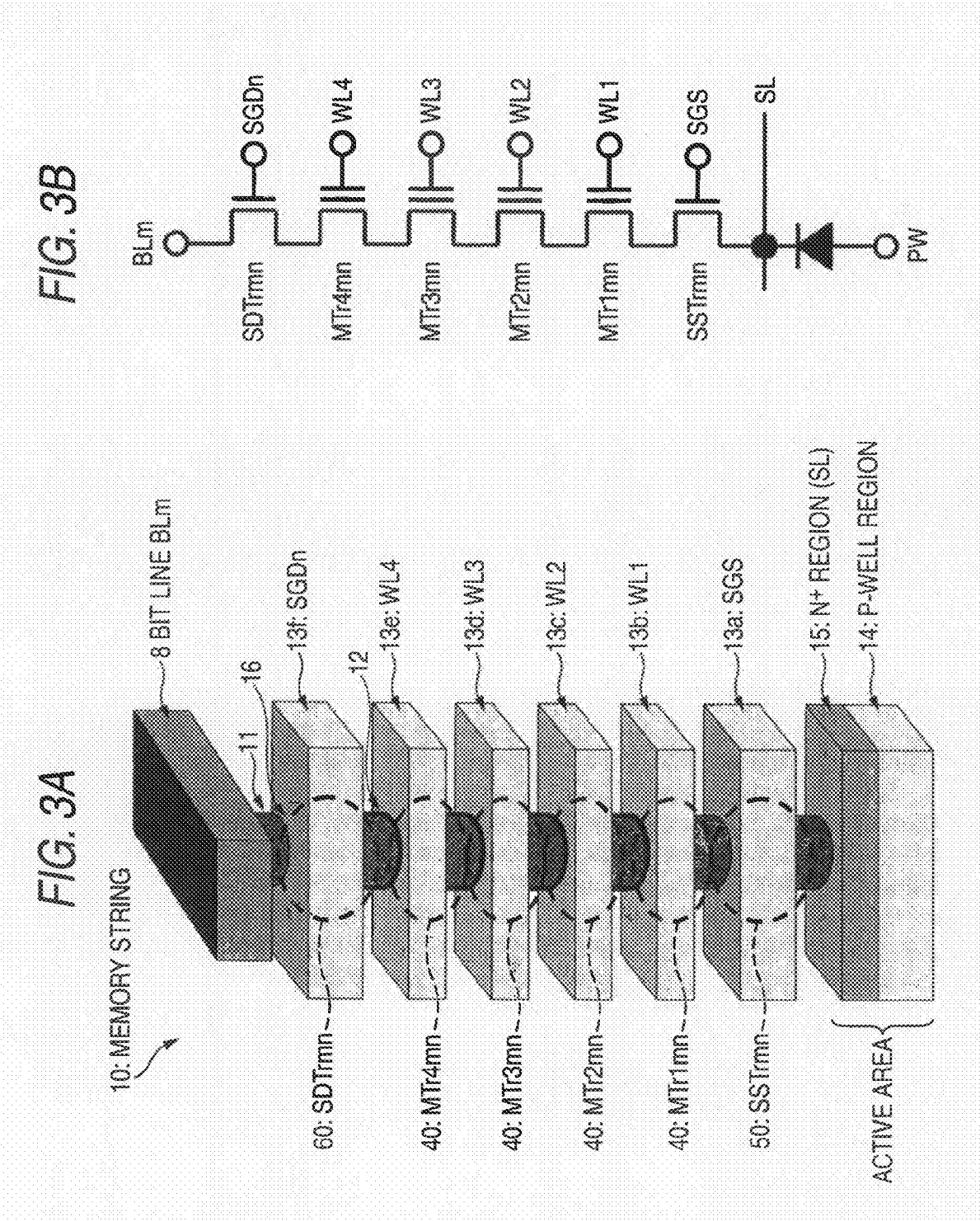
FIG. 3 is a view showing a schematic structure of the memory string 10 that is one of the nonvolatile semiconductor storage device 1 of the first embodiment.

The nonvolatile semiconductor storage device 1 of the first embodiment includes a plurality of the memory strings 10. FIG. 3A shows a schematic structure of one of the memory strings 10 (the mn$^{th}$ memory string). FIG. 3B shows an equivalent circuit diagram of the memory string 10. The memory string 10 has four memory transistors MTr1mn 40 to MTr4nm 40 and two selection transistors SSTrmn 50 and SDTrmn 60, all of which are connected in series. In the semiconductor substrate, an n+ region 15 is formed on the P-type region (P-Well region) 14. In the memory string 10, a columnar semiconductor 11 is formed on the N$^+$ region 15. In a part corresponding to the four memory transistors MTr1mn 40 to MTr4nm 40, an insulating film 12 (for example, a so-called an ONO film including a silicon oxide film, a silicon nitride film, and a silicon oxide) capable of storing a charge is formed around the columnar semiconductor 11. Further, planar electrodes 13b to 13e are formed around the insulting film 12. In a part corresponding to the two selection transistors SSTrmn 50 and SDTrmn 60, an insulating film 12 made of, for example, a single layer of a silicon oxide film is formed around the columnar semiconductor 11, and planar electrodes 13a and 13f are respectively formed around the insulating film 12. In this embodiment, the electrodes 13a to 13f, the insulating film 12, and the columnar semiconductor 11 respectively constitute the memory transistors MTr1mn 40 to MTr4nm 40, the selection transistor SSTrmn 50, and the selection transistor SDTrmn 60, all of which operate in a depression mode. The electrodes 13b to 13e are to serve as the word lines WL1 to WL4 (7); the electrode 13f is to serve as the selection gate line SGDn; and the electrode 13a is to serve as the selection gate line SGS. A bit line BLm 8 is connected to one of the source/drain regions of the selection transistor SDTrmn 60, and a source line SL (an N$^+$ region 15 in the present embodiment) 70 is connected to one of source/drain regions of the selection transistor SSTrmn 50. The embodiment shows an example in which four memory transistors MTr are connected in series to one memory string 10. However, the number of memory transistors MTr is not limited to four but is determined as necessary.

Operation of the nonvolatile semiconductor storage device of the first embodiment having the above structure will be described hereunder.

(Reading Operation)

Figure 4:
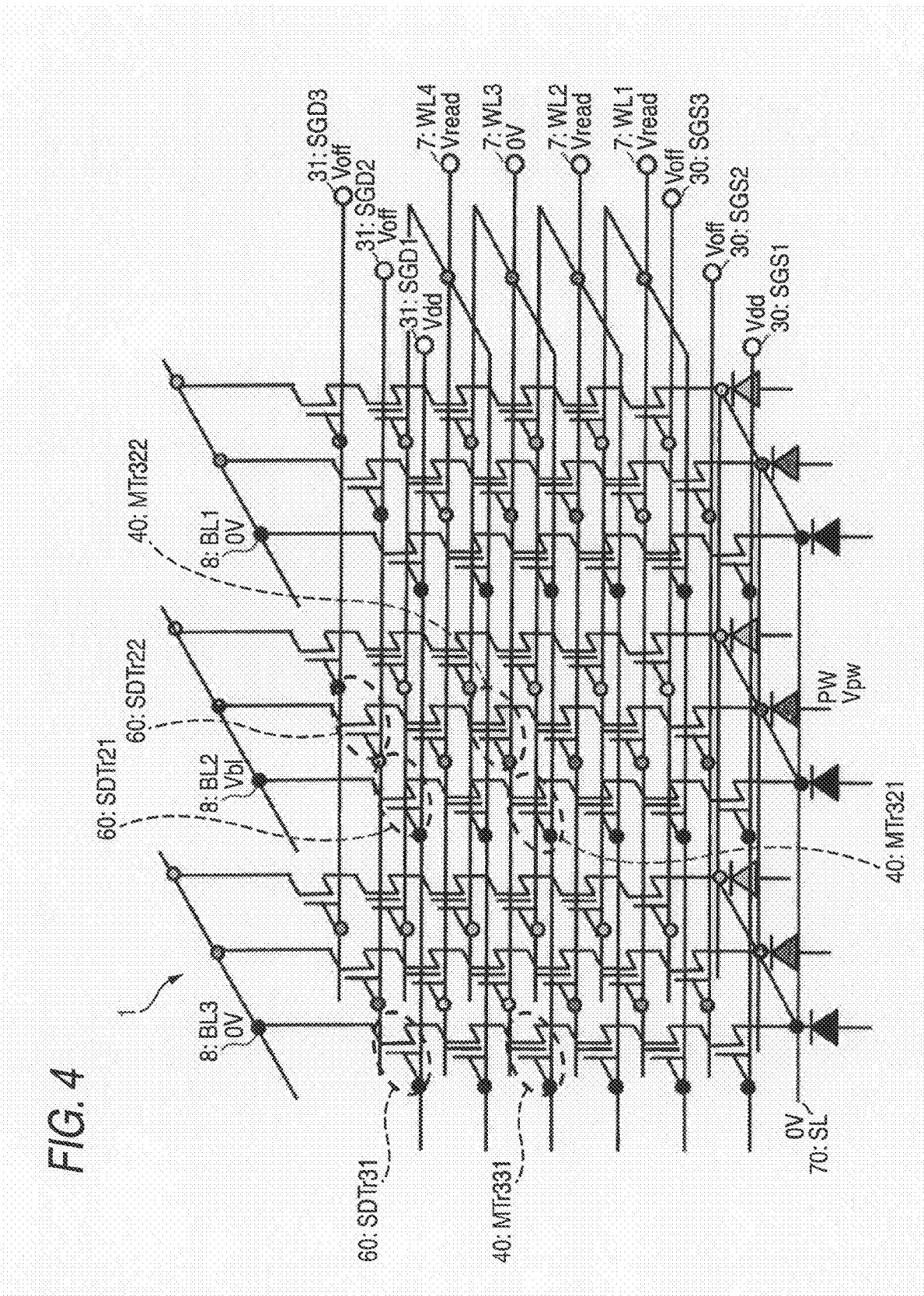
FIG. 4 is a view showing a biased state achieved when the nonvolatile semiconductor storage device 1 of the first embodiment performs operation for reading data from a memory transistor MTr3 indicated by a dotted line.

FIG. 4 is a view showing a biased state achieved when the nonvolatile semiconductor storage device 1 of the first embodiment performs operation for reading data from a memory transistor MTr321 (40) indicated by a dotted line. Herein, descriptions are provided on the assumption that a memory transistor MTr of the present embodiment is a so-called MONOS vertical transistor and that a threshold value Vth (a neutral threshold value) of the memory transistor MTr acquired when no electrons are accumulated in a charge storage layer is in the vicinity of 0V.

When data are read from the memory transistor MTr 321 (40), Vb1 (e.g., 0.7V) is applied to a bit line BL2 (8); 0V is applied to the other bit lines BL8; 0V is applied to the source line SL70; Vdd (e.g., 3.0V) is applied to the selection gate lines SGD1 (31) and SGS1 (30); Voff (e.g., 0V) is applied to the other selection gate lines SGD31 and SGS30; and Vpw (e.g., 0V; Vpw may be of any potential, so long as the P-well region 14 and the memory string 10 are not forwardly biased) is applied to the P-well region 14. The word line WL3 (7) is set to 0V; the other word lines WL7 are set to Vread (e.g., 4.5V); and an electric current of the bit line BL2 (8) is subjected to sensing, thereby enabling reading of data about a bit (MTr321).

In the nonvolatile semiconductor storage device 1 of the first embodiment, each of the word lines WL1 to WL4 (7) is connected to a plurality of the memory stings 10. Also, each of the selection gate lines SGS1 (30) to SGS3 (30) is connected to a plurality of the memory strings 10. However, a data of an arbitrary memory transistor can be read.

(Writing Operation)

Figure 5:
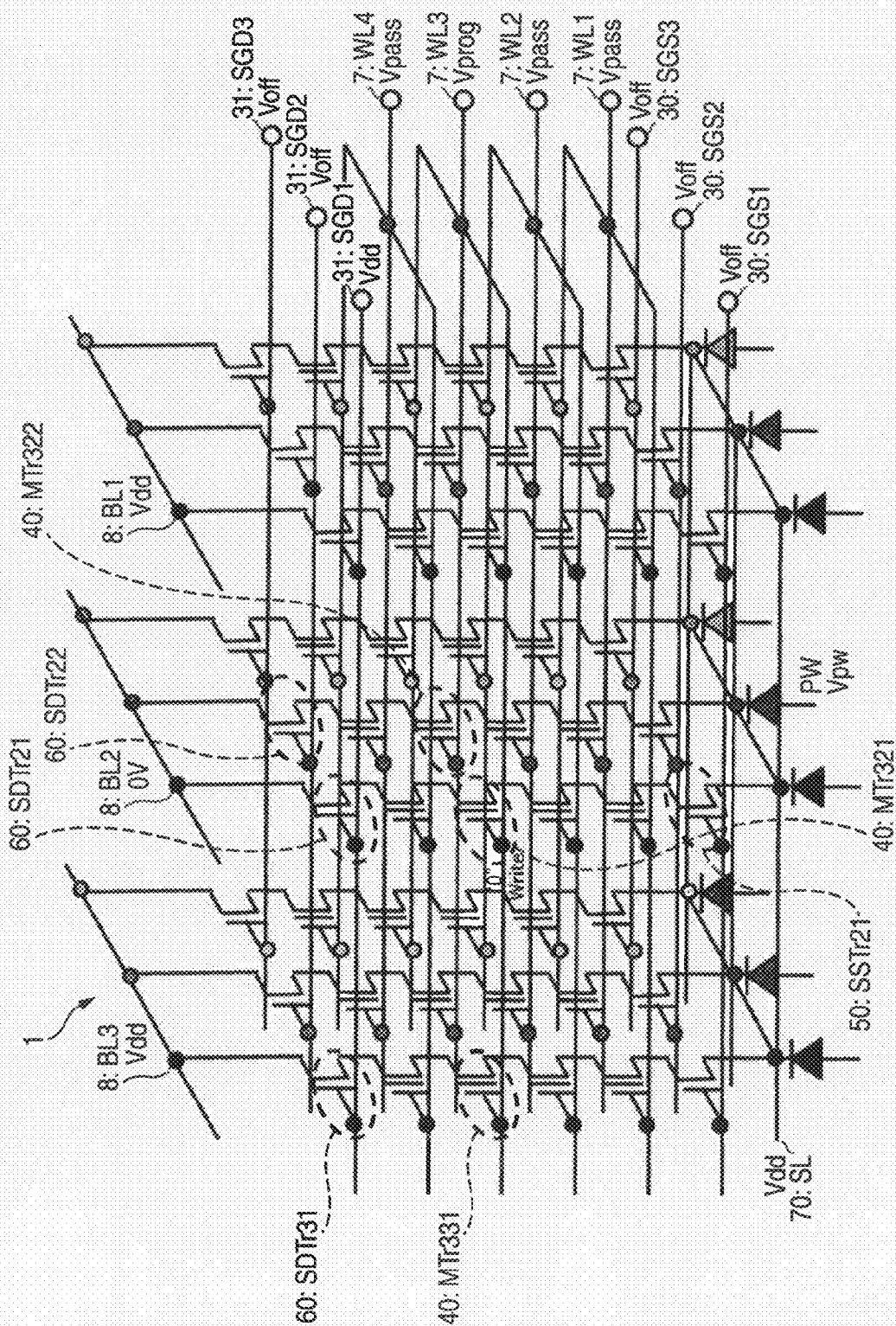
FIG. 5 is a view showing a biased state achieved when the nonvolatile semiconductor storage device 1 of the first embodiment performs operation for writing data in the memory transistor MTr3 indicated by the dotted line.

FIG. 5 is a view showing a biased state achieved when the nonvolatile semiconductor storage device 1 of the first embodiment performs operation for writing data in the memory transistor MTR321 (40) indicated by the dotted line.

When data "0" are written into the memory transistor MTr321 (40), 0V is applied to the bit line BL2 (8); Vdd is applied to the other bit lines BL8; Vdd is applied to the source line SL70; Vdd is applied to the selection gate lines SGD1 (31); Voff is applied to the other selection gate lines SGD 31; Voff is applied to the selection gate lines SGS1 (30) to SGS3 (30); Vpw (e.g., 0V) is applied to the P-Well region 14; Vprog (e.g., 18V) is applied to the word line WL3 (7); and Vpass (e.g., 10V) is applied to the other word lines WL7. As a result, electrons are injected into the charge storage layer, and the threshold value of the memory transistor MTr321 (40) is shifted in a positive direction.

When data "1" are written into the memory transistor MTr321 (40); namely, when electrons are not injected into the charge storage layer, Vdd is applied to the bit line BL2 (8), whereupon the selection transistor SDTr21 (60) is brought into an off state. Thus, electrons are not injected into the charge storage layer of the memory transistor MTr321 (40).

Writing of a page is enabled by means of appropriately setting the potentials of the respective bit lines BL8 to 0V or Vdd.

(Erasing Operation)

Figure 6:
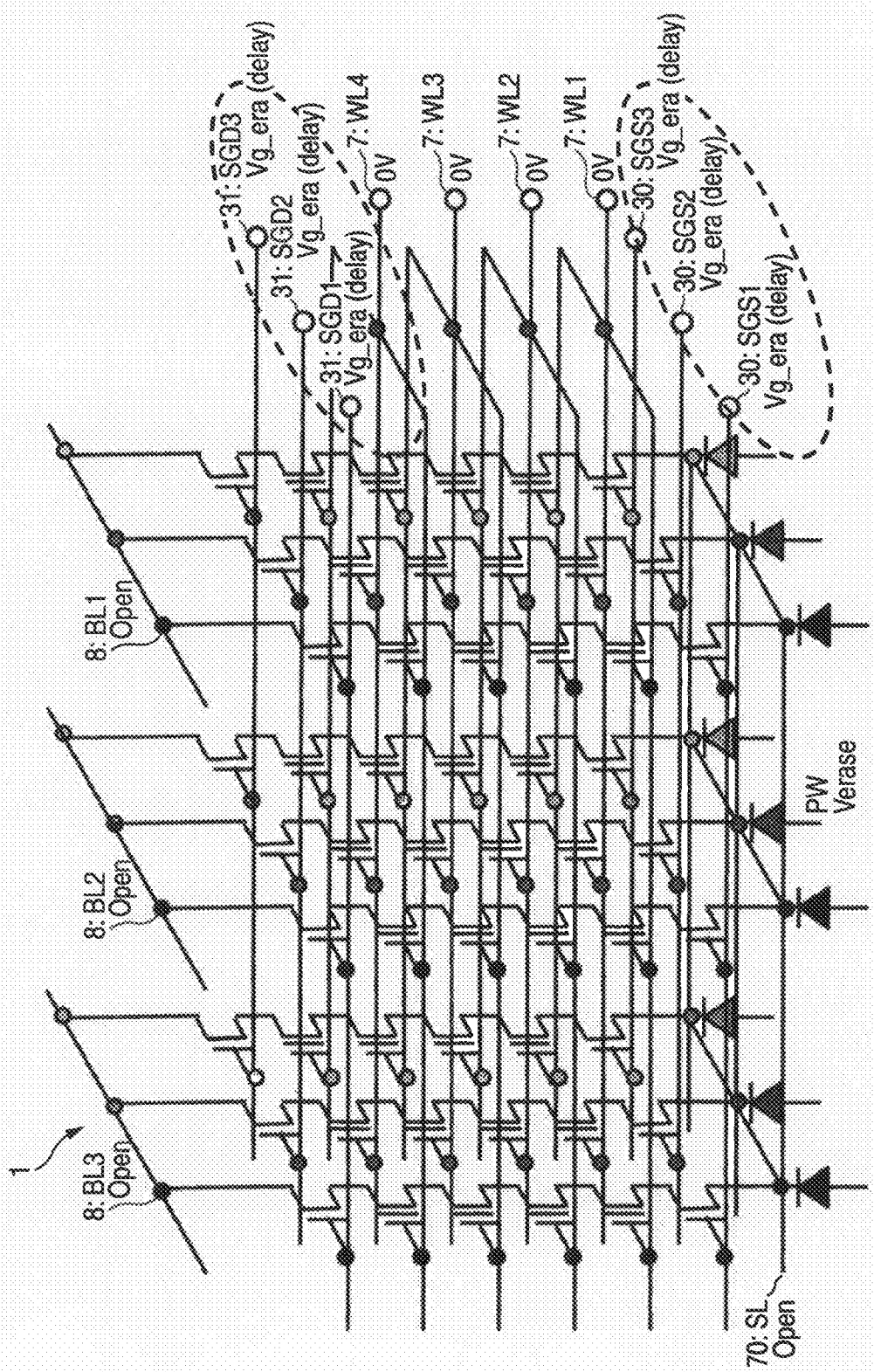
FIG. 6 is a view showing a biased state of a selected block achieved when the nonvolatile semiconductor storage device 1 of the first embodiment performs operation for erasing data from memory transistors MTr of a selected block.
Figure 7:
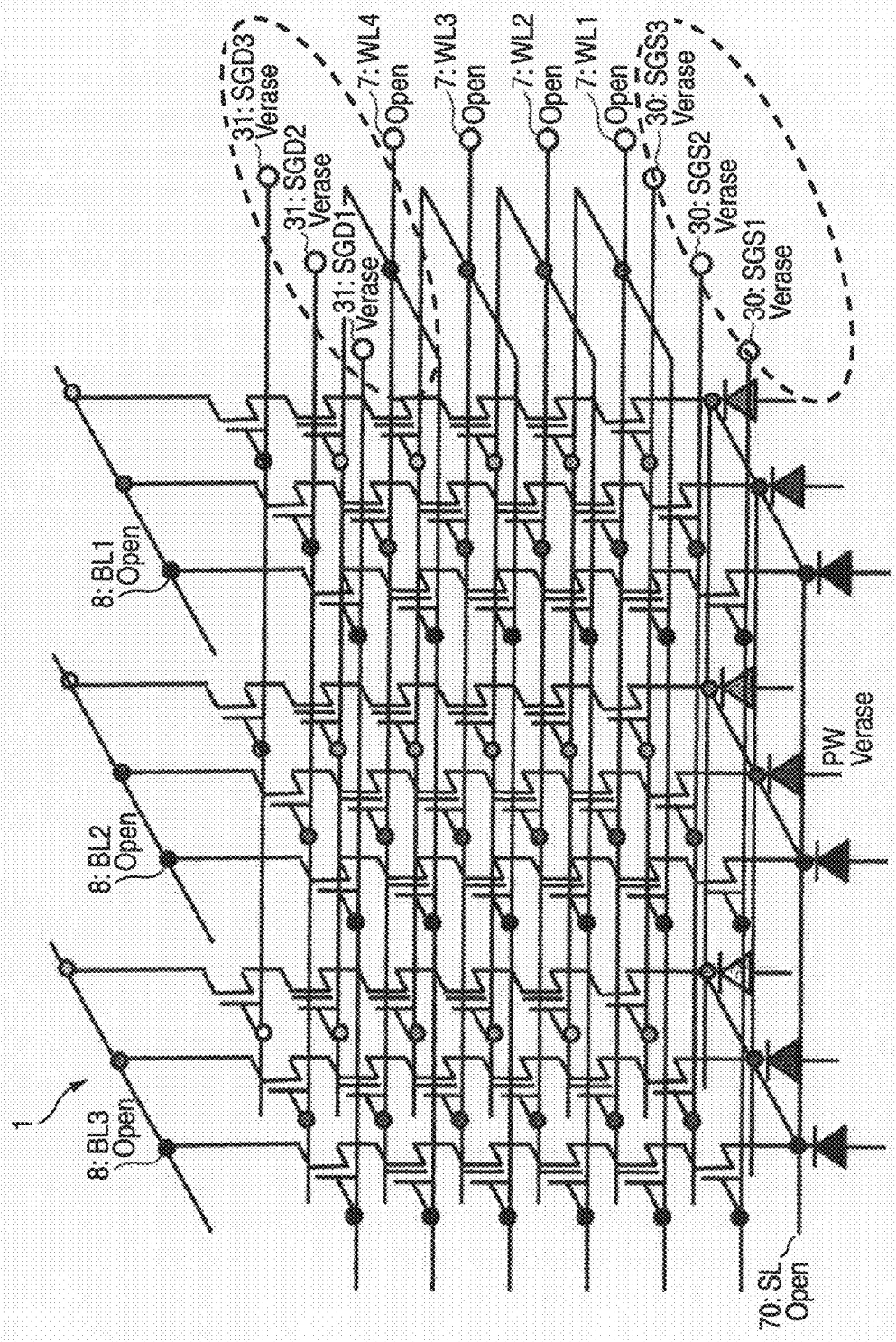
FIG. 7 is a view showing a biased state of an unselected block achieved when the nonvolatile semiconductor storage device 1 of the first embodiment performs operation for erasing data from the memory transistors MTr of the selected block.

Data erasing operation is performed in units including a plurality of memory strings. FIG. 6 is a view showing a biased state of a selected block achieved when the nonvolatile semiconductor storage device 1 of the first embodiment performs operation for erasing data from the memory transistors MTr of the selected block. FIG. 7 is a view showing a biased state of an unselected block achieved when the nonvolatile semiconductor storage device 1 of the first embodiment performs operation for erasing data.

In FIG. 6, Verase (e.g., 20V) is applied to the P-well region 14 in a selected block (a block whose data are desired to be erased), thereby bringing the source line SL 70 into a floating state and increasing the potential of the selection gate lines SGS 30 and the SGD 31 (to, e.g., 15V) while a timing is slightly deviated (e.g., about 4 μsec) from the timing at which Verase is applied to the P-well region 14. As a result, an electric potential close to Verase is transmitted to a channel formation region (a body section) of the memory transistor MTr. Hence, when the word lines WL1 to WL4 (7) are set to; e.g., 0V, electrons in the electric charge storage layer of the memory transistor MTr are pulled to the P-well, so that data can be erased.

In the meantime, as shown in FIG. 7, the word lines WL1 to WL4 (7) are brought into a floating state in the unselected block, the potential of the word lines WL1 to WL4 (7) is increased by means of coupling action, thereby preventing occurrence of a potential difference between the charge storage layers of the memory transistors MTr1 to MTr4 and the word lines. Hence, extraction (erasure) of electrons from the charge storage layers is not performed.

Table 1 shows a relationship among electric potentials achieved by "reading operation," "writing operation," and "erasing operation" of the nonvolatile semiconductor storage device 1 of the first embodiment.

TABLE 1

| | Read | Write"0" | Write"1" | Erase (Selected) | Erase (Unselected) |
|---|---|---|---|---|---|
| BL | Vbl | 0 | Vdd | Vdd | Verase | Verase |
| SGD | Vdd | Vdd | Vdd | Vera del | Vera del |
| WL4 | Vread | Vpass | Vpass | 0 | open |
| WL3 | 0 | Vprog | Vprog | 0 | open |
| WL2 | Vread | Vpass | Vpass | 0 | open |
| WL1 | Vread | Vpass | Vpass | 0 | open |
| SGS | Vdd | Voff | Voff | Vera del | Vera del |
| SL | 0 | Vdd | Vdd | open | open |
| PW | 0 | 0 | 0 | Verase | Verase |

(Manufacturing Method)

A detailed method for manufacturing the nonvolatile semiconductor storage device 1 of the first embodiment will be provided below. Namely, the device undergoes the processes of: forming a lower select gate (SGS) layer; collectively depositing a memory cell layer and an upper select gate (SGD) layer; collectively forming holes for use in forming channel sections of the two layers in a photo engraving process; depositing amorphous silicon (a-Si), polysilicon (Poly-Si), or the like, in the holes, to thus form channels; and forming via holes for use in connecting word lines to the word-line drive circuits. In the nonvolatile semiconductor storage device including three-dimensionally stacked memory cell layers, a memory cell region is formed as a result of a memory cell layer—where a plurality of memory cells are fabricated—being three-dimensionally (stereoscopically) stacked into a plurality of layers on respective amorphous silicon films (or may also be polysilicon films) which each have a two-dimensional planar structure and which are to serve as word-line electrodes. In relation to connection of the word-line drive circuit, or the like, to the respective amorphous silicon films that are to serve as word-line electrodes, via holes are formed stereoscopically. However, since the plurality of memory cell layers are stacked three-dimensionally as mentioned above, the following problems are encountered in forming via holes in the respective memory cell layers according to the related-art technique. Specifically, a first problem lies in that there arises a necessity for processing ends of the respective memory cell layers—where the via holes are to be formed—so as not to overlap with respect to the vertical direction. Moreover, when the ends of the memory cell layers undergo processing, it may also be the case where the respective via holes must be processed to different heights (depths). A second problem lies in that difficulty is encountered in forming the via holes in a single process depending on the number of memory cell layers to be stacked and that there arises a necessity for processing the respective via holes in separate processes. In this case, there may also arise a problem of an increase in the number of processes adding to manufacturing cost.

In the nonvolatile semiconductor storage device 1 of the first embodiment, the plurality of amorphous silicon films of the memory cell layer which are to serve as word-line electrodes, a plurality of silicon oxide films which are to serve as insulating films, and an amorphous silicon film and a silicon oxide film which form an upper select gate layer spread two-dimensionally in the memory transistor region. However, ends of these films in a direction orthogonal to the bit lines are bent upwardly with respect to the substrate, and the ends are planarized by means of CMP, or the like, to thus form planar end faces. Accordingly, first, the ends of the respective memory cell layers in which the via holes are to be formed do not overlap each other with respect to the vertical direction. Second, the essential requirement is to process the respective via holes to an essentially-equal height (depth). Hence, via holes can be formed in the respective memory cell layers and the upper select gate layer in a single process, thereby enabling cutting of the number of processes and curtailing of manufacturing cost.

Figure 8:
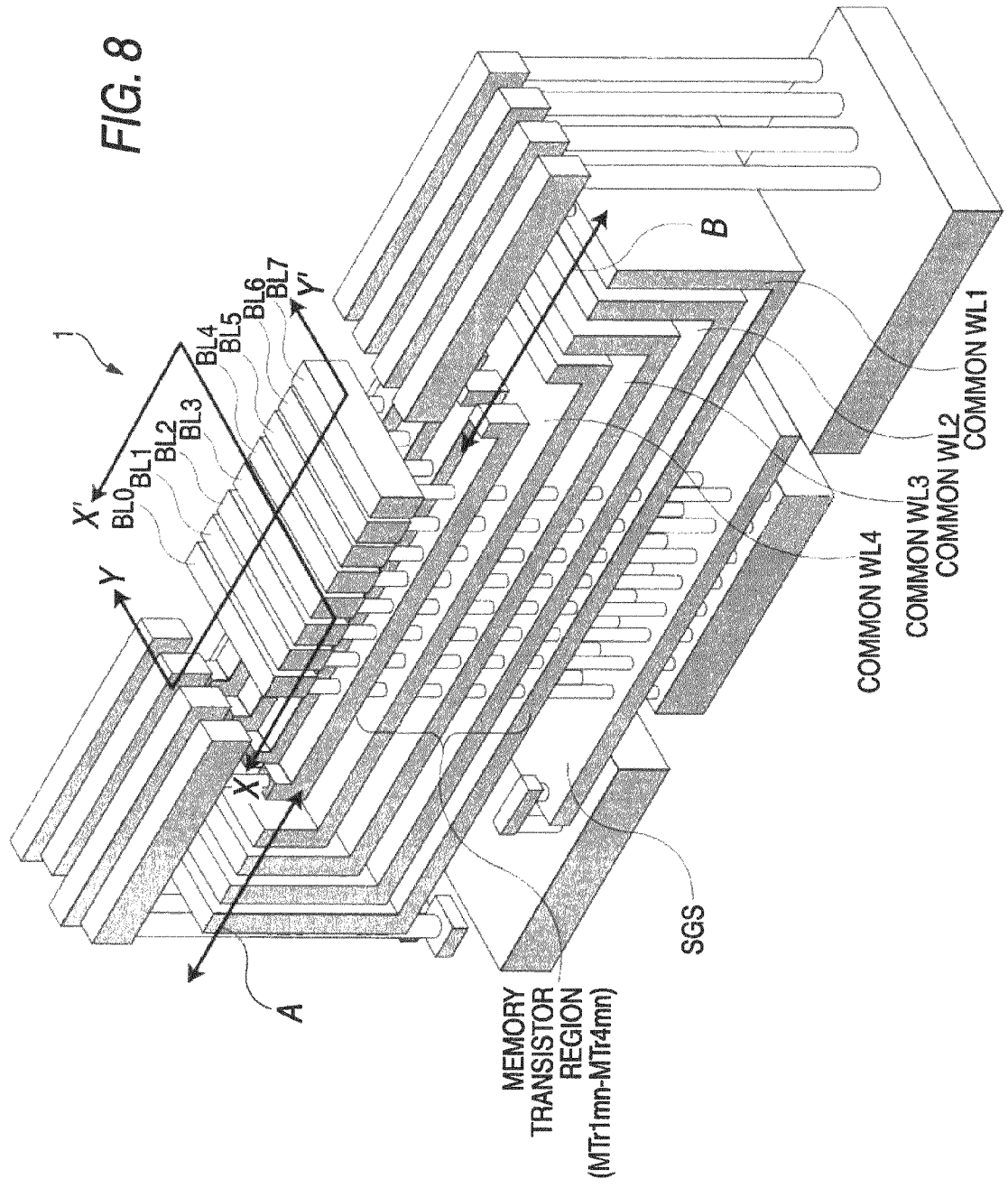
FIG. 8 shows a bird's-eye view of the nonvolatile semiconductor storage device 1 of the first embodiment.

FIG. 8 shows a bird's-eye view of the nonvolatile semiconductor storage device 1 of the first embodiment. The nonvolatile semiconductor storage device 1 of the first embodiment has a structure in which memory transistors are stacked on a semiconductor substrate. As shown in FIGS. 1 and 8, the word lines WL1 to WL4 (7) two-dimensionally spread in the region (the memory transistor region 2) where respective memory cells are formed. Ends of the word lines WL1 to WL4 (7) in a direction orthogonal to the bit lines are bent upwardly with respect to the substrate and have planar end faces. Put another way, amorphous silicon films which are to serve as word-line electrodes (or polysilicon films may also be acceptable) and interlayer insulating films are alternately stacked in a concave shape. End faces of essentially-vertical portions of the respective layers are formed so as to become planar end faces. Therefore, via holes which connect the word-line drive circuit 3 to the respective word lines WL1 to WL4 (7) can be formed by means of a single photoengraving process. Through use of the via holes formed concurrently in the photo engraving process, the bit lines BL 8 are connected to the sense amplifiers 6, and the selection gate lines SGD 31 are connected to the selection gate line SGD drive circuits 5.

As mentioned previously, the respective word lines WL1 to WL4 (7) are formed by means of a common conductor layer in each layer (a memory cell layer) in which a plurality of memory cells are fabricated two-dimensionally. Therefore, the number of word-line drive circuits 3 can be reduced significantly, and a reduction in chip area can be realized.

Processes for manufacturing the nonvolatile semiconductor storage device 1 of the first embodiment are described by reference to FIGS. 9 through 18. In FIGS. 9 through 18, a peripheral circuit region here peripheral circuits, such as the word-line drive circuits and the sense amplifier circuits, are fabricated—is shown on the left side, and the memory transistor region is shown on the right side. Regions A, B and regions corresponding to cross-sectional profiles X-X' and Y-Y' in the nonvolatile semiconductor storage device 1 of the first embodiment shown in FIG. 8 are illustrated in the memory transistor region. While the nonvolatile semiconductor storage device 1 is shown in FIG. 8, the peripheral circuit region is formed on the same substrate thereas and disposed thereoutside.

Figure 9:
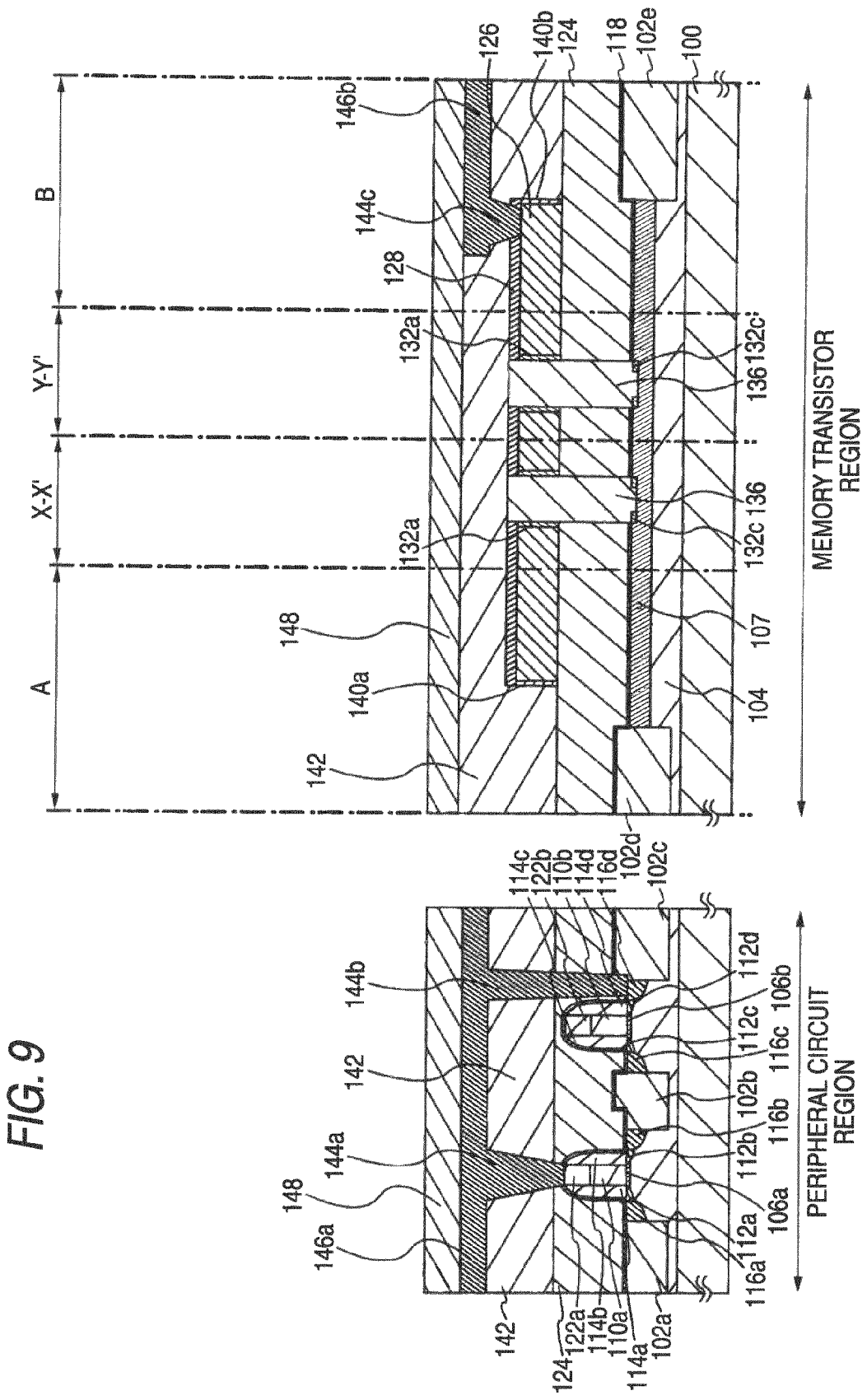
FIG. 9 is a view showing processes for manufacturing the nonvolatile semiconductor storage device 1 of the first embodiment.

First, a method for manufacturing the lower select gate layer will be described by reference to FIG. 9. Element isolation regions STI 102a, 102b, 102c, 102d, and 102e are formed on the semiconductor substrate 100. The P-well region 104 is formed by injection of boron (B) ions, and boron (B) ions are further injected to a neighborhood of the surface of the substrate 100, thereby forming channel implanted regions 106a and 106b which adjust a threshold value Vth of the transistors. Next, phosphor (P) ions are injected solely into the memory cell transistor region, to thus form an n+ diffusion region 107 which is to serve as the source lines SL. A polysilicon (poly-Si) film doped with a conductive impurity, such as phosphor (P), is etched, to thus form gate electrodes 11a and 10b of transistors in the peripheral circuit region. Next, P ions or As ions are injected into an N-channel transistor region in the peripheral circuit region, to thus form N-type regions 112a, 112b, 112c, and 112d. A silicon nitride film deposited on the entire substrate is anisotropically etched, to thus form sidewalls 114a, 114b, 114c, and 114d. Arsenic (As) ions are injected into a region of N-channel transistors in the peripheral circuit region, to thus form source/drain regions 116a, 116b, 116c, and 116d. B ions are injected to a region of P-channel transistors in the peripheral circuit region, to thus form source/drain regions (not shown). Next, a silicon nitride film (a barrier silicon nitride film) 118 is formed over the entire substrate. Cobalt silicide (CoSi$_2$) layers 122a and 122b are formed by means of sputtering and heating. A BPSG film 124 is formed over the entire substrate by means of well-known CVD. An amorphous silicon film (or a polysilicon film) 126 which is doped with a conductive impurity, such as P (phosphor); and which is to serve as selection gate lines SGS in the memory transistor region are deposited, to thus further form a silicon nitride film 128. Holes (hereinafter sometimes called "transistor plug holes") are formed in a photo resist process. The substrate is heated, to thus form a thermal oxide film 132a (a first gate insulating film) which is to serve as a gate insulating film of a selection gate transistor SSTr and to form a block silicon nitride film (not shown). Subsequently, the block silicon nitride and the thermal oxide film on the bottoms of the holes are removed by means of well-known wet etching or dry etching, thereby forming a thermal oxide film 132c. The block silicon nitride film is removed, to thus form an amorphous silicon (a-Si) film over the entire substrate. Subsequently, the amorphous silicon film is subjected to CMP, thereby forming columnar amorphous silicon layers (first columnar semiconductors) 136. Next, the memory transistor region is processed by means of a PEP, to thus form a titanium (Ti) film. The film is subjected to a heat treatment, thereby creating titanium silicide (TiSi) layers 140a and 140b. Cobalt silicide (CoSi$_2$) may also be adopted. Next, a silicon oxide film 142 is formed as a pre-metal insulating film (PMD). Next, trenches for interconnection purpose are formed, and a tungsten (W) film is embedded in the trenches. The trenches are then subjected to CMP, thereby forming tungsten (W) plugs 144a, 144b, and 144c and interconnects 146a and 146b. Next, a silicon oxide film 148 is formed by use of TEOS (Tetraethoxysilane) (FIG. 9). Hereinafter, a silicon oxide film formed through use of TEOS will sometimes be called TEOS. The lower select gate layer is formed through the above processes.

Figure 10:
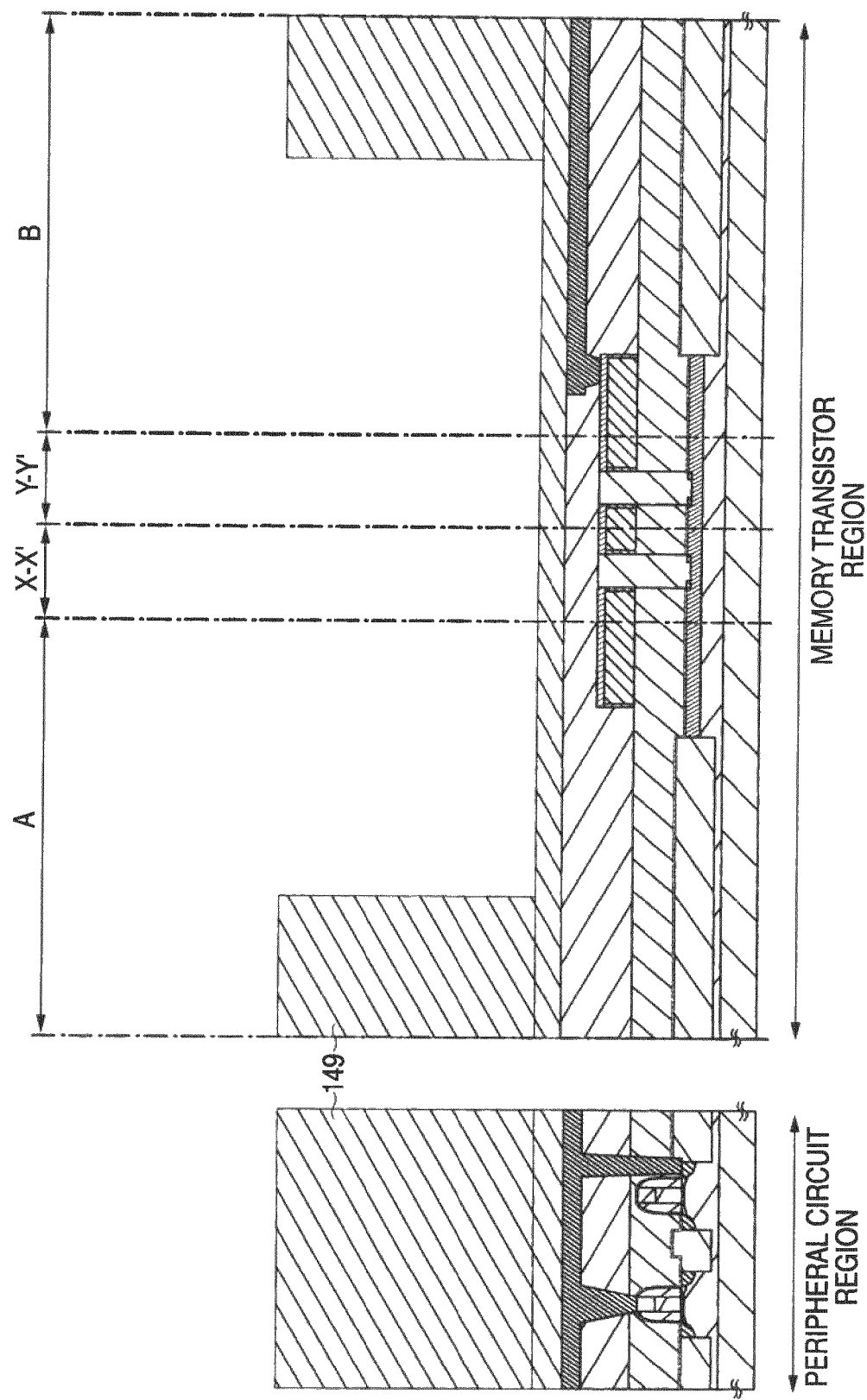
FIG. 10 is a view showing the processes for manufacturing the nonvolatile semiconductor storage device 1 of the first embodiment.

A method for manufacturing memory cell layers and select gate layers will now be described. In the nonvolatile semiconductor storage device of the first embodiment, a process for etching end sections of the respective layers in a tapered manner so as to assume a stepped shape can be omitted, and contacts for use in connection of the word lines WL1 to WL4 can be formed in a single process. Accordingly, the number of processes can be cut significantly, thereby preventing an increase in manufacturing cost. Specifically, there is provided a process for depositing a silicon oxide film 149 as an interlayer insulating film by means of thermal CVD or plasma CVD after formation of the silicon oxide film 148; subsequently forming a resist film (not shown) in a portion of the region A and a portion of the region B which are shown in FIG. 8; and anisotropically etching the portion of the region A in the memory transistor region, the region where memory transistors are to be fabricated (hereinafter called a "memory region"), and the portion of the region B by means of dry etching, to thus form openings (FIG. 10). Films to be stacked through the above processes can be stacked into a concave shape whose center is recessed. By means of such processes, the number of subsequent processes can be cut. The silicon oxide film 149 is deposited so as to become thicker than a presumed thickness (height) of a plurality of amorphous silicon films, that of a plurality of silicon oxide films, and that of the entirety silicon nitride film, all of which are to be stacked on the silicon oxide film 149.

Figure 11:
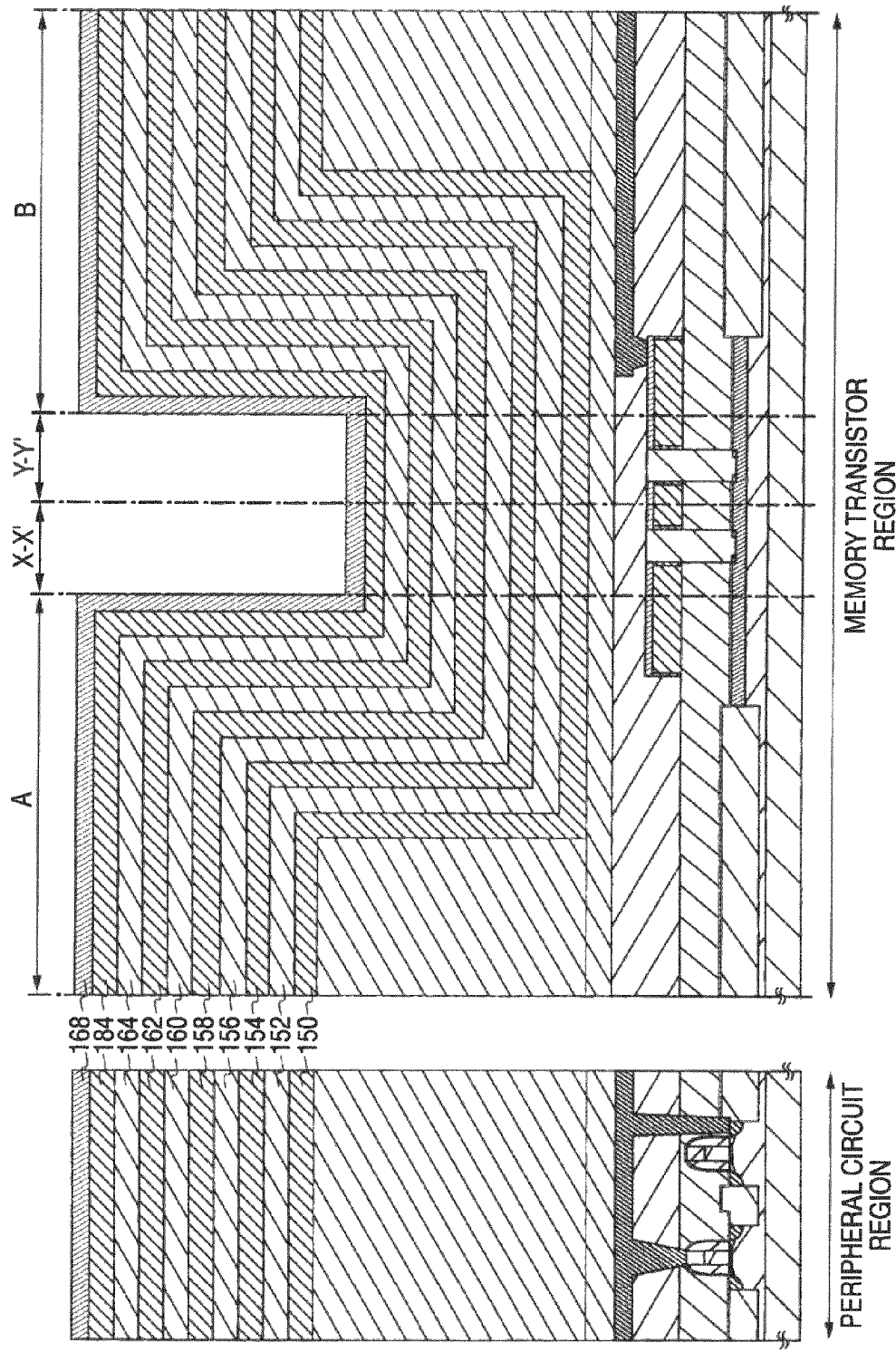
FIG. 11 is a view showing the processes for manufacturing the nonvolatile semiconductor storage device 1 of the first embodiment.

An amorphous silicon film (or a polysilicon film) doped with a conductivity impurity, such as phosphor (P), and a silicon oxide film serving as an insulating film between control gates are formed alternately, thereby forming amorphous silicon films 150, 154, 158, 162, and 184 and silicon oxide films 152, 156, 160, and 164. Moreover, a silicon nitride film 168 is formed (FIG. 11). The present embodiment exemplifies an example in which an amorphous silicon film which is to serve as a word line is stacked into four layers. However, the number of layers to be stacked is not limited to four, and the number of layers into which an amorphous silicon film and a silicon oxide film are stacked can be increased, as necessary.

At this time, since the portions of the region A, the memory region, and the portions of the region B are opened through the above-described processes, the stacked amorphous silicon films (150, 154, 158, 162, and 184), the silicon oxide films (152, 156, 160, and 164), and the silicon nitride film 168 are deposited horizontally with respect to the substrate at the bottoms of the respective openings and also deposited on the sidewalls of the openings in a bent manner. Consequently, the films are deposited into a concave pattern in a recessed manner (FIG. 11). By means of the process shown in FIG. 10, the silicon oxide film 149 is deposited so as to become thicker than the entire thickness of the plurality of deposited films, and the openings are formed in the silicon oxide film 149. Hence, the depths of the opening sections are made greater than the depth of the entirety of the plurality of films.

Figure 12:
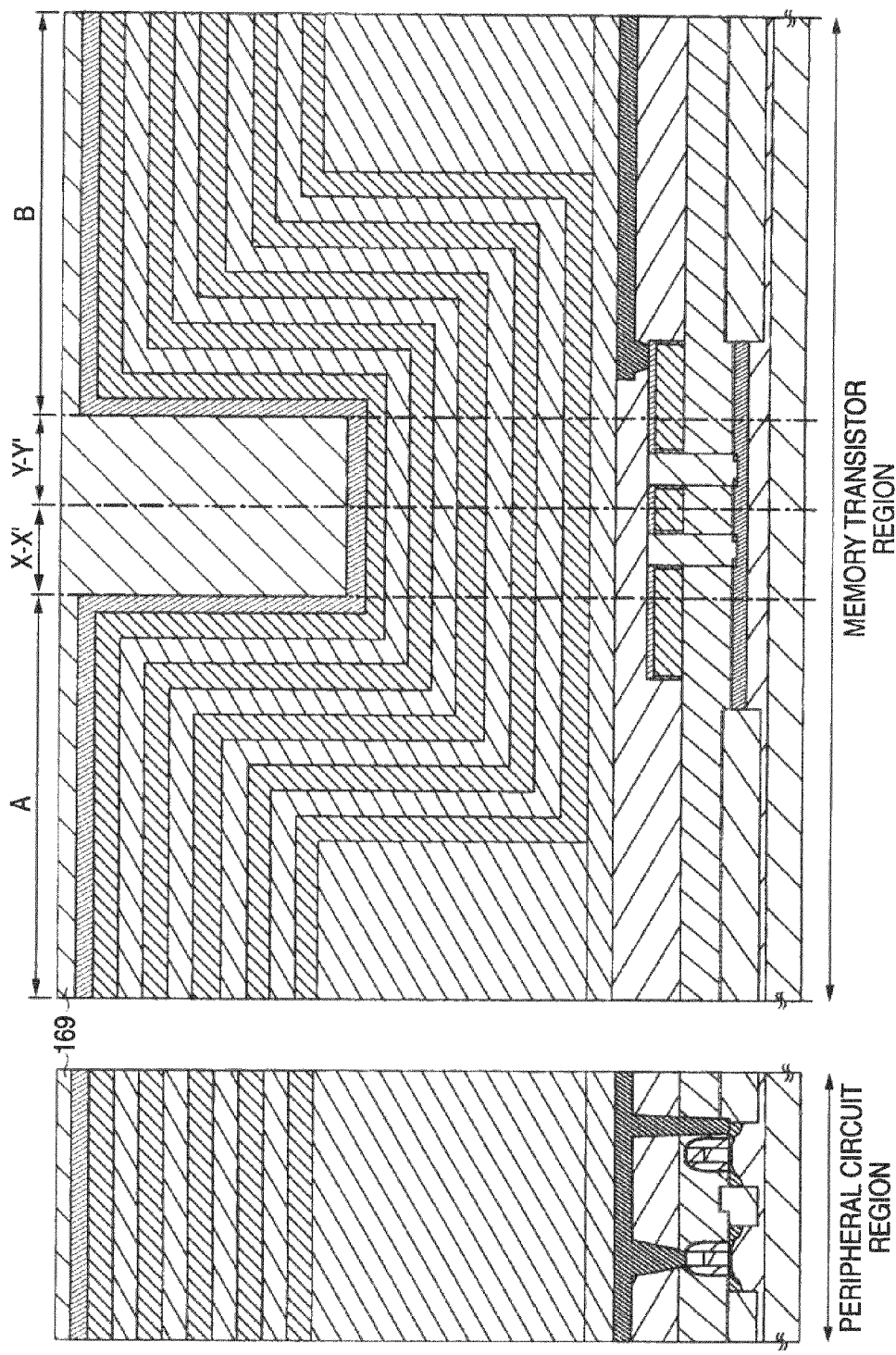
FIG. 12 is a view showing the processes for manufacturing the nonvolatile semiconductor storage device 1 of the first embodiment.

Next, a coating-type low-dielectric-constant interlayer insulating film SOG (Spin On Glass) 169 is applied and planarized (FIG. 12).

Figure 13:
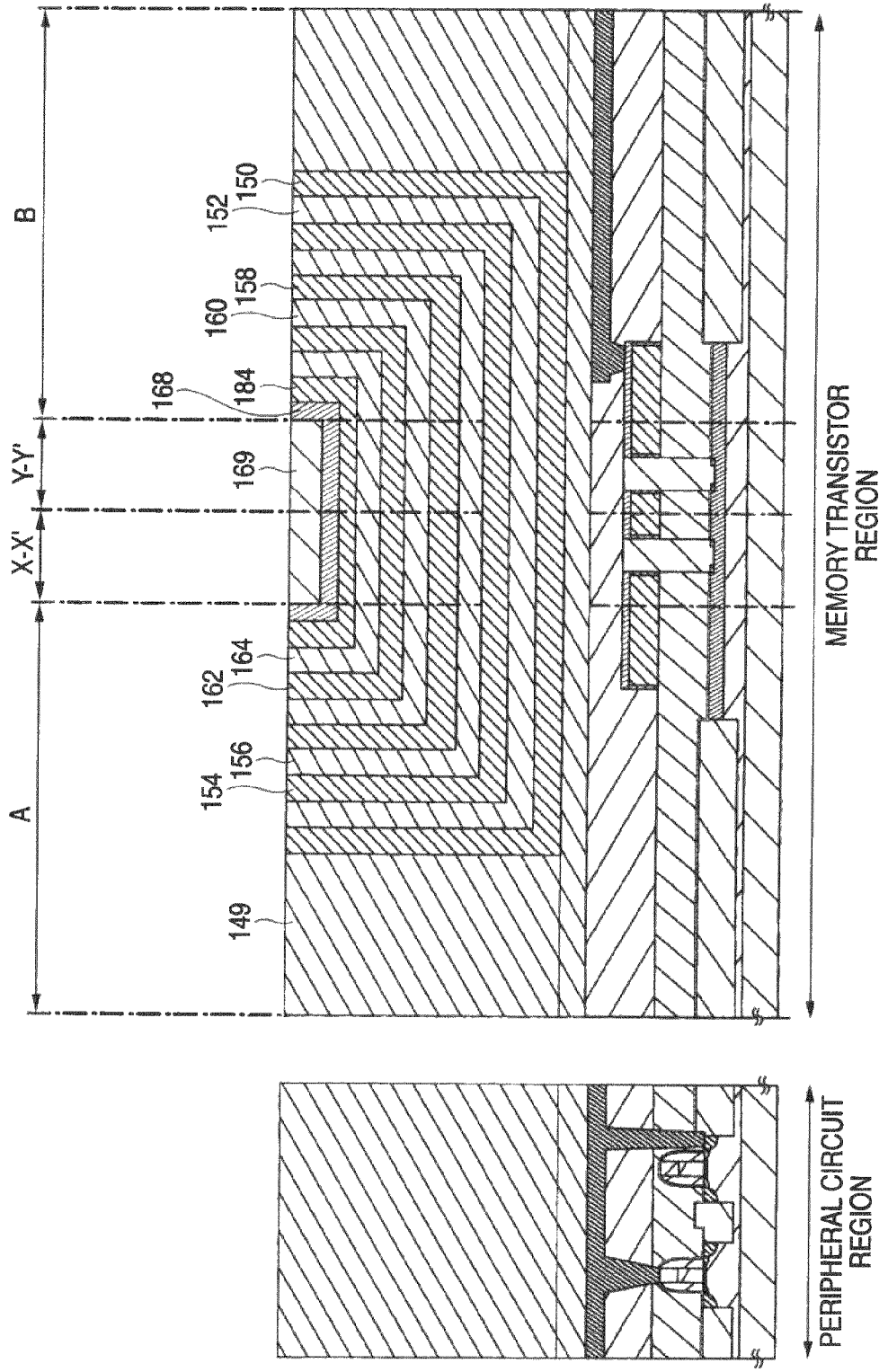
FIG. 13 is a view showing the processes for manufacturing the nonvolatile semiconductor storage device 1 of the first embodiment.

Films from the SOG 169 to the lowermost stacked amorphous silicon film 150 are collectively planarized by means of CMP (FIG. 13). In a process shown in FIG. 11, these films are deposited in such a way that the films spread two-dimensionally in the memory transistor region and that the ends of the respective films in the direction orthogonal to the bit lines are folded upwardly with respect to the substrate. Since they are collectively planarized, the planarized films come to have flat end faces which reside a single plane.

Figure 14:
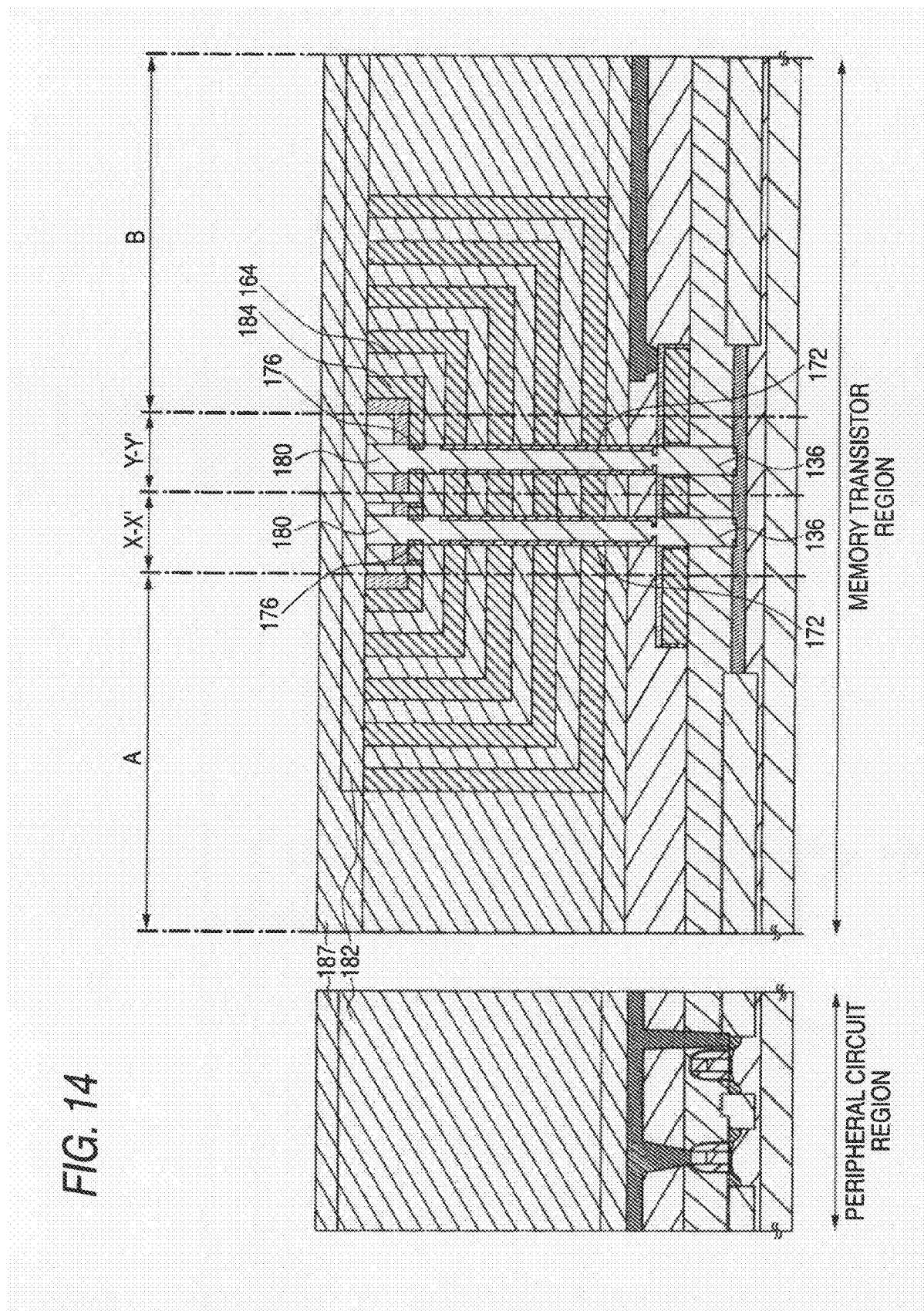
FIG. 14 is a view showing the processes for manufacturing the nonvolatile semiconductor storage device 1 of the first embodiment.

Next, an interlayer insulating film (BPSG) (not shown) is formed and planarized by means of CMP. Memory plug holes for forming columnar semiconductors (body sections) of the memory transistors and the upper selection gate transistors SDTr are created. A first silicon oxide film (a first insulating film), a silicon nitride film, and a silicon oxide film (a second insulating film) are sequentially deposited, to thus form a laminated film that is so-called an ONO film 172. The silicon nitride film is to serve as a charge storage layer of the memory transistor. Next, a photo resist is formed and etched back, to thus remove the ONO film 172 from the amorphous silicon films 184 and the silicon oxide film 164 in the peripheral circuit region and an inner wall of the memory plug hole. The photo resist is then removed and subjected to heat treatment, to thus form a thermal oxide film (a second gate insulating film) 176 which is to serve as a gate insulating film of the upper selection gate transistors SDTr. A spacer silicon nitride film is formed in the memory plug holes by means of anisotropic etching, and the spacer silicon nitride film and the ONO film 172 at the bottoms of the holes are etched back, to thus enable establishment of electrical conduction with the channel sections 136. An amorphous silicon film is deposited after removal of the spacer silicon nitride film, and the thus-deposited film is subjected to CMP, thereby forming a columnar amorphous silicon layer 180 (a second columnar semiconductor) which is to serve as channel sections of the memory cells and channel sections of the upper selection gate transistors SDTr. Next, the layers (the silicon nitride film 168 and the amorphous silicon film 184) of the upper selection gate transistors SDTr are separated by means of PEP and RIE, and an interlayer insulating film (BPSG) 182 is deposited and planarized by means of CMP. Contacts of the layer of the upper selection gate transistors SDTr are ensured at an adjacent end of the region A in the direction Y of the Y-Y' direction in FIG. 14. Next, a silicon oxide film 187 is formed as a pre-metal insulating film (PMD) and planarized by means of CMP (FIG. 14).

Figure 15:
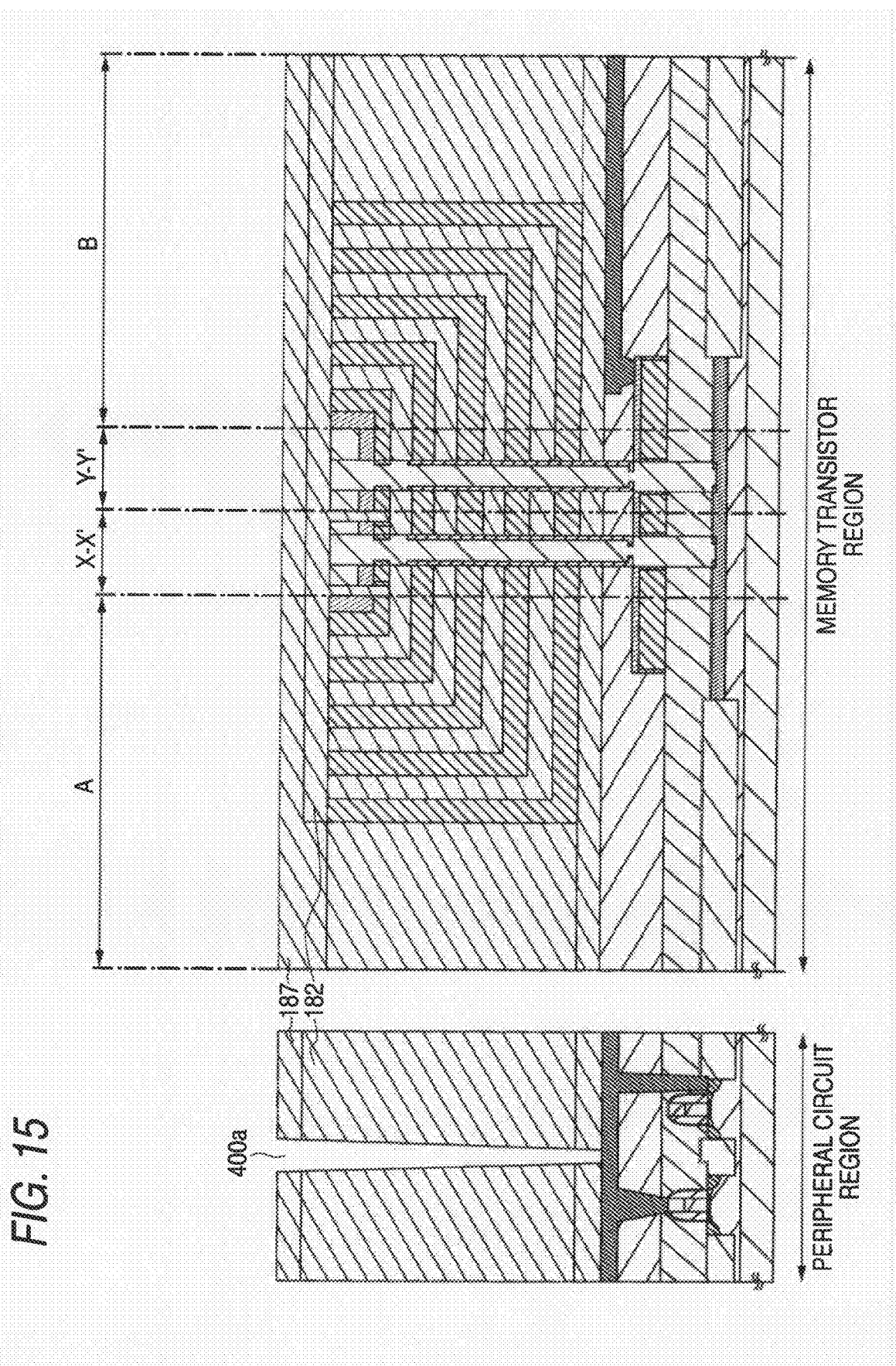
FIG. 15 is a view showing the processes for manufacturing the nonvolatile semiconductor storage device 1 of the first embodiment.

Interconnect via holes 400a of the peripheral circuit are formed by means of PEP and RIE (FIG. 15).

Figure 16:
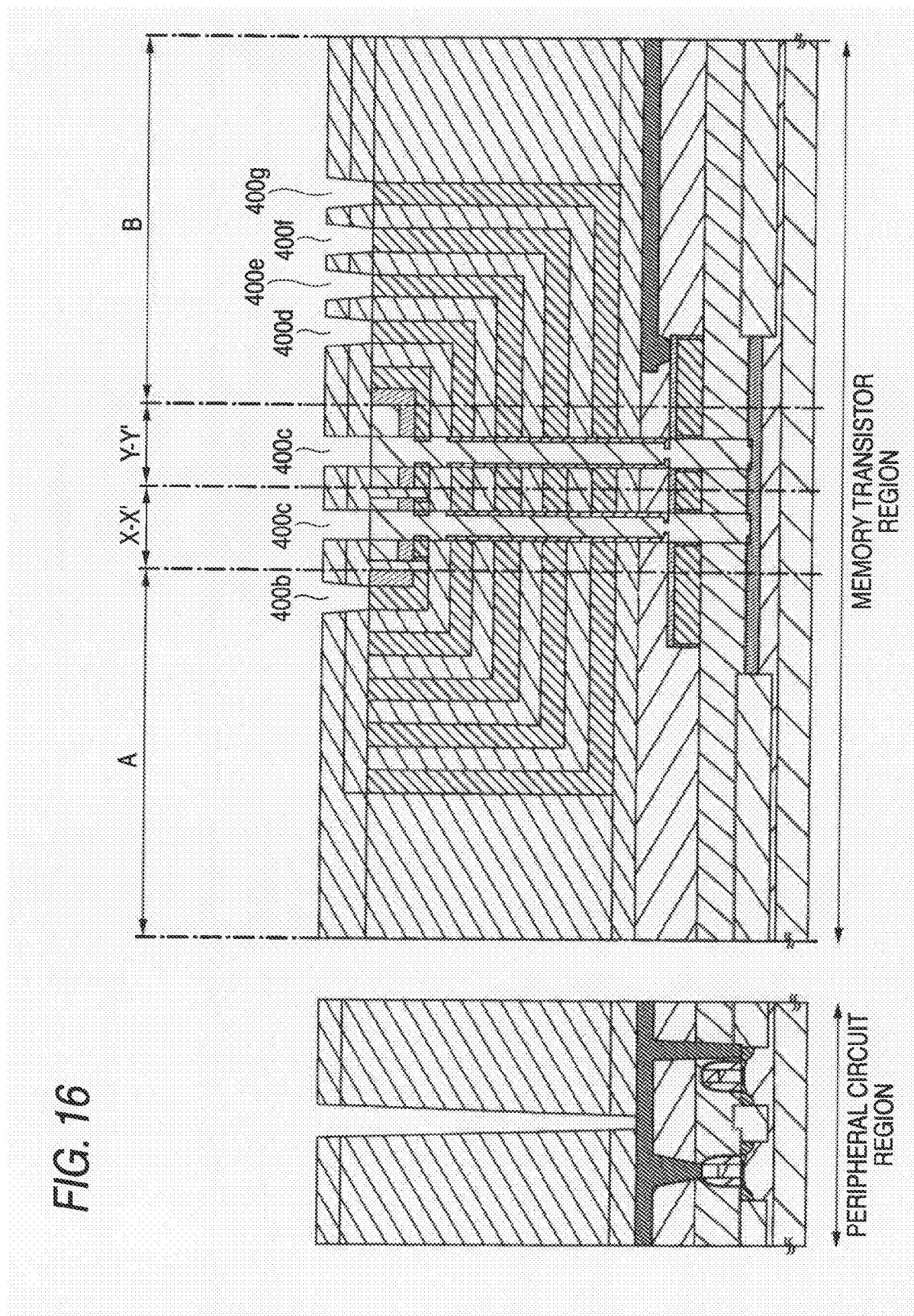
FIG. 16 is a view showing the processes for manufacturing the nonvolatile semiconductor storage device 1 of the first embodiment.

Via holes 400b, 400c, 400d, 400e, 400f, and 400g of the memory transistor region are collectively formed, by means of PEP and RIE, on the end faces of the amorphous silicon films (150, 154, 158, and 162) planarized and uncovered through the previously-described processes (FIG. 16).

Figure 17:
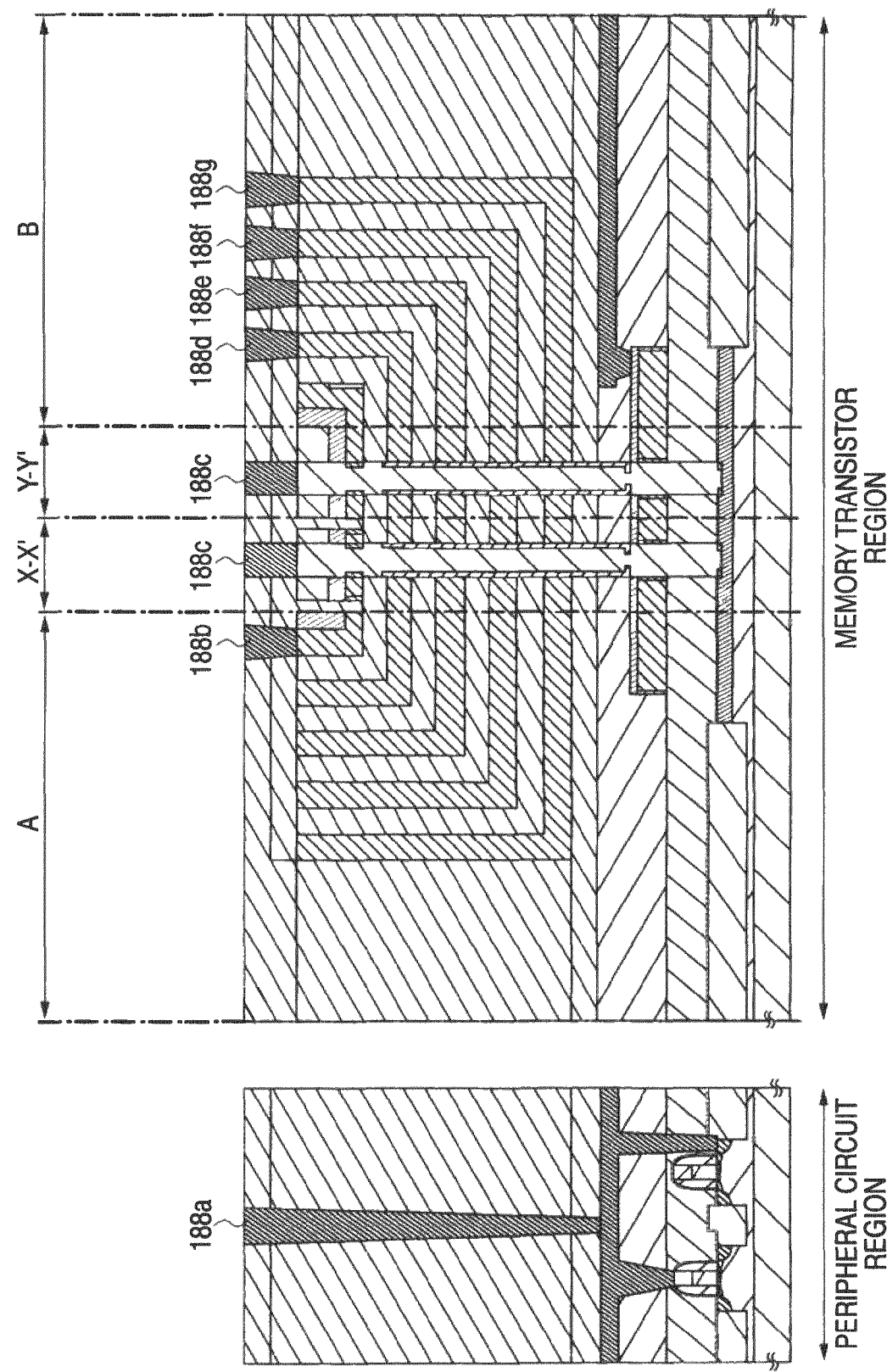
FIG. 17 is a view showing the processes for manufacturing the nonvolatile semiconductor storage device 1 of the first embodiment.

A tungsten film is formed in the via holes 400a, 400b, 400c, 400d, 400e, 400f, and 400g formed in the previously-described photo engraving processes, and are planarized by means of CMP, to thus form tungsten plugs 188a, 188b, 188c, 188d, 188e, 188f, and 188g (FIG. 17).

As mentioned previously, in the nonvolatile semiconductor storage device of the first embodiment, the amorphous silicon films (150, 154, 158, and 162) which are to serve as word-line electrodes and the interlayer insulating films (152, 156, and 160) are tacked alternately into a concave shape, and ends of the concave films in the direction orthogonal to the bit lines of the respective films are planarized. Specifically, the respective films spread two-dimensionally, and the ends of the films in the direction orthogonal to the bit lines of the respective films are bent upwardly with respect to the substrate and have flat end faces. Further, the end faces of the respective films constitute a single plane. Accordingly, the via holes 400d, 400e, 400f, and 400g formed in the end faces of the respective films have essentially-identical depths. Hence, the four holes can be formed in a single PEP and in a single RIE process. The via holes 400b for connecting the amorphous silicon films 184—which are to serve the drain-side selection gate lines SGD 31—to the drain-side selection gate lines (SGD) drive circuit 5 and the via holes 400c for connecting the columnar amorphous silicon layers 180 (the second columnar semiconductors)—which are to serve as the channel sections of the memory cells and the channel sections of the upper selection gate transistors SDTr—to the bit lines BL have essentially the same depth as that of the via holes 400d, 400e, 400f, and 400g. Hence, the via holes 400b, 400c, 400d, 400e, 400f, and 400g can be formed by means of a single PEP and a single RIE process.

Since the interconnect via holes 400a of the peripheral circuit differ from the other via holes (400b, 400c, 400d, 400e, 400g, and 400g) in terms of a depth, the via holes 400a are difficult to process, and there may arise a case where the via holes 400a must be processed in another process. Accordingly, in the nonvolatile semiconductor storage device of the first embodiment, the via holes 400a are created by means of another PEP and another RIE process before creation of the other via holes as shown in FIG. 15.

Figure 18:
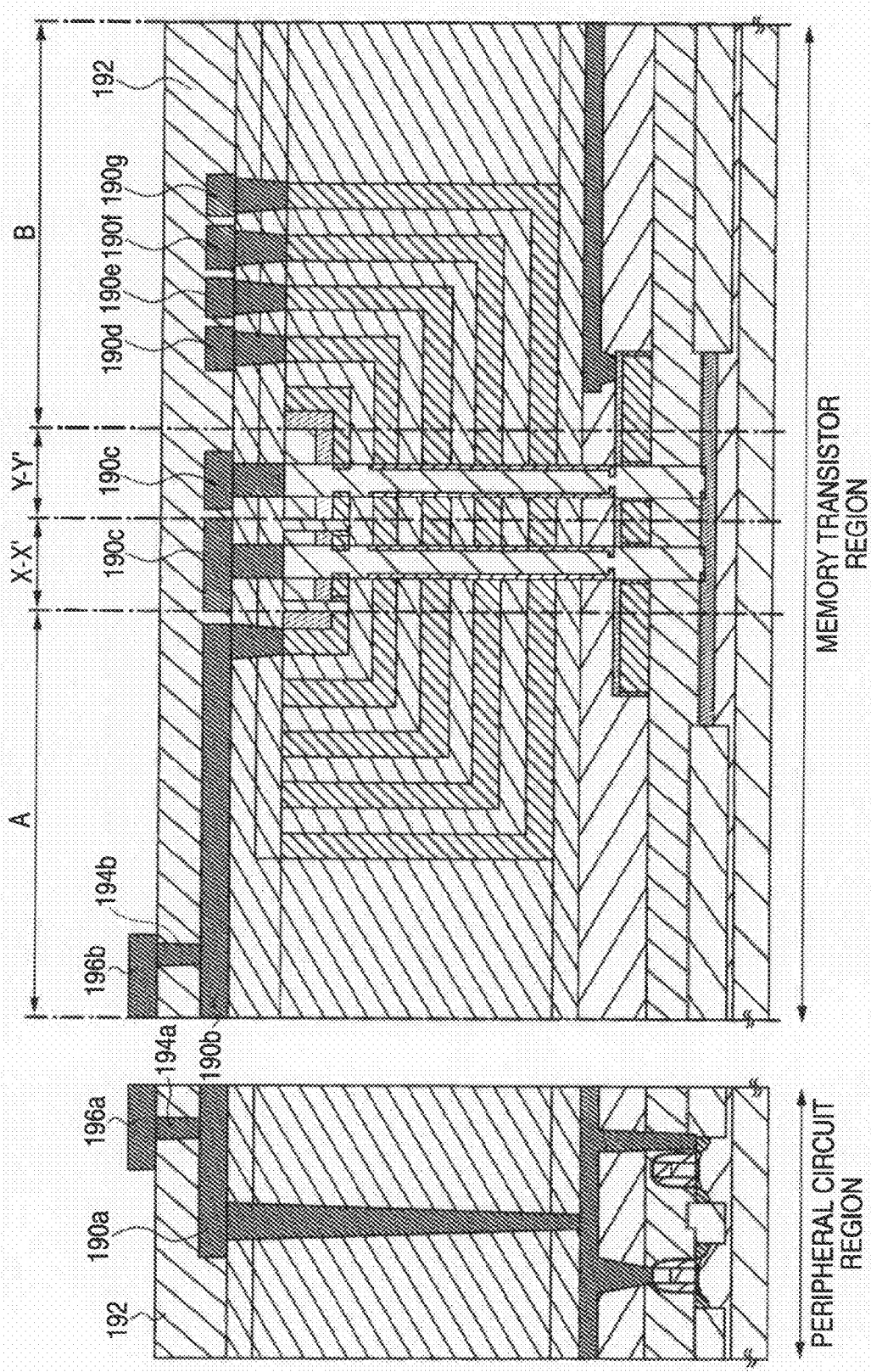
FIG. 18 is a view showing the processes for manufacturing the nonvolatile semiconductor storage device 1 of the first embodiment.

An aluminum (Al) film is formed and undergoes the photo engraving process, to thus form electrodes 190a, 190b, 190c, 190d, 190e, 190f, and 190g. Subsequently, an interlayer insulating film (BPSG) 192 is formed and planarized by means of CMP. After via holes have been formed by means of the PEP, the holes are filled with a tungsten film. The films are then subjected to CMP, thereby forming tungsten plugs 194a and 194b. An aluminum film is then formed and undergoes a PEP, thereby forming aluminum electrodes 196a and 196b (FIG. 18).

The nonvolatile semiconductor storage device 1 of the first embodiment can be manufactured through the foregoing processes.

Figure 19:
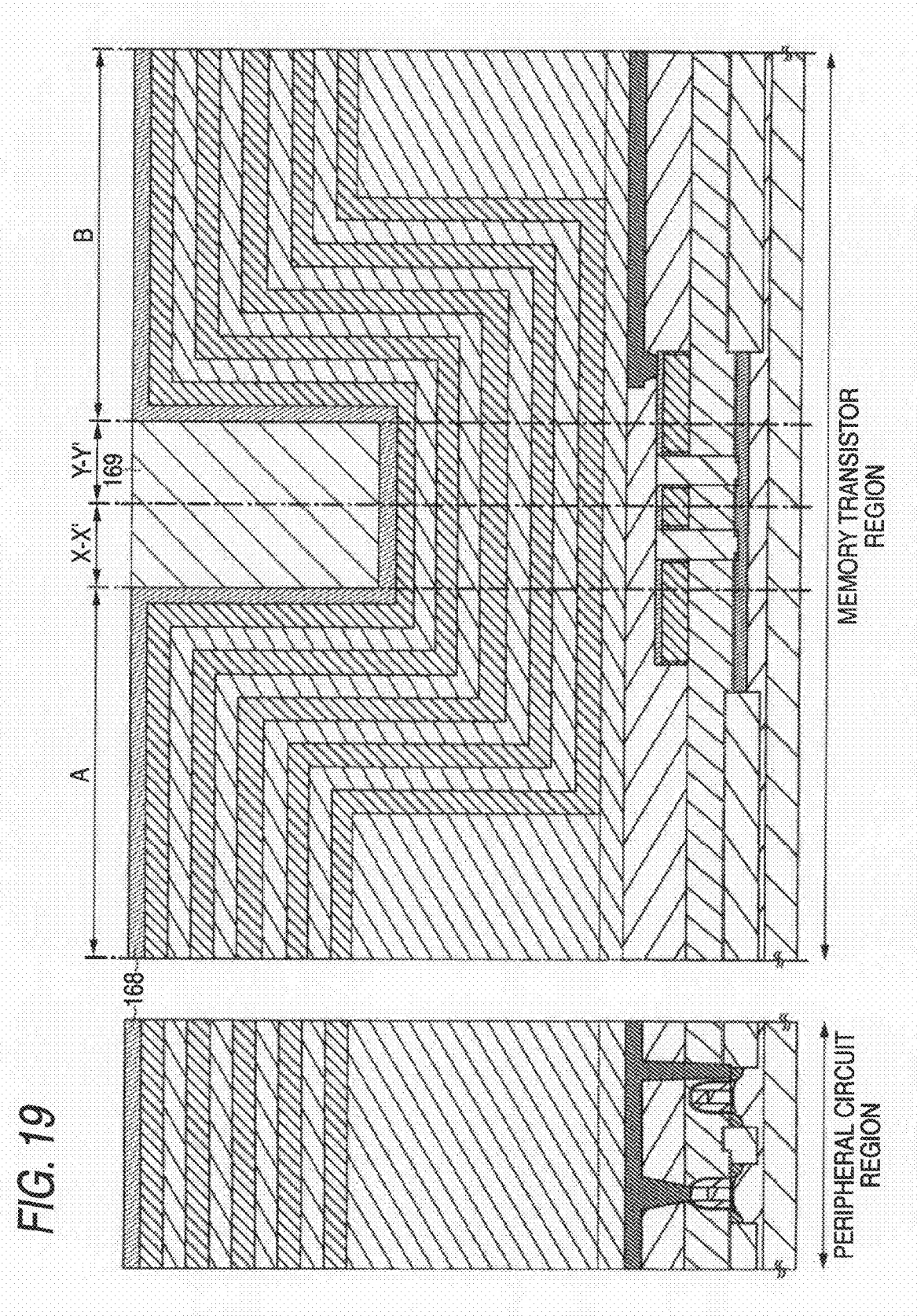
FIG. 19 is a view showing the processes for manufacturing the nonvolatile semiconductor storage device 1 of the first embodiment.
Figure 20:
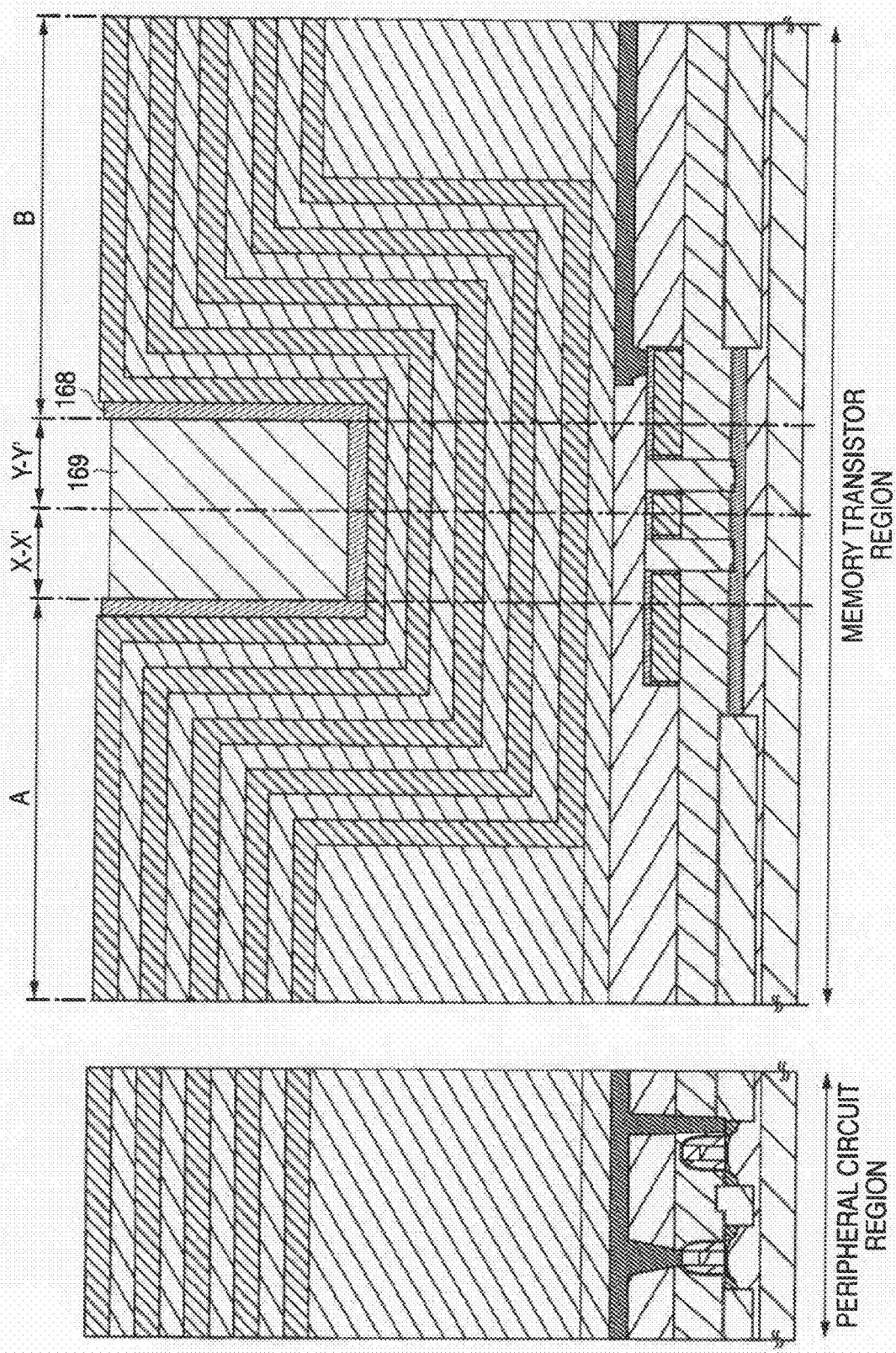
FIG. 20 is a view showing the processes for manufacturing the nonvolatile semiconductor storage device 1 of the first embodiment.
Figure 21:
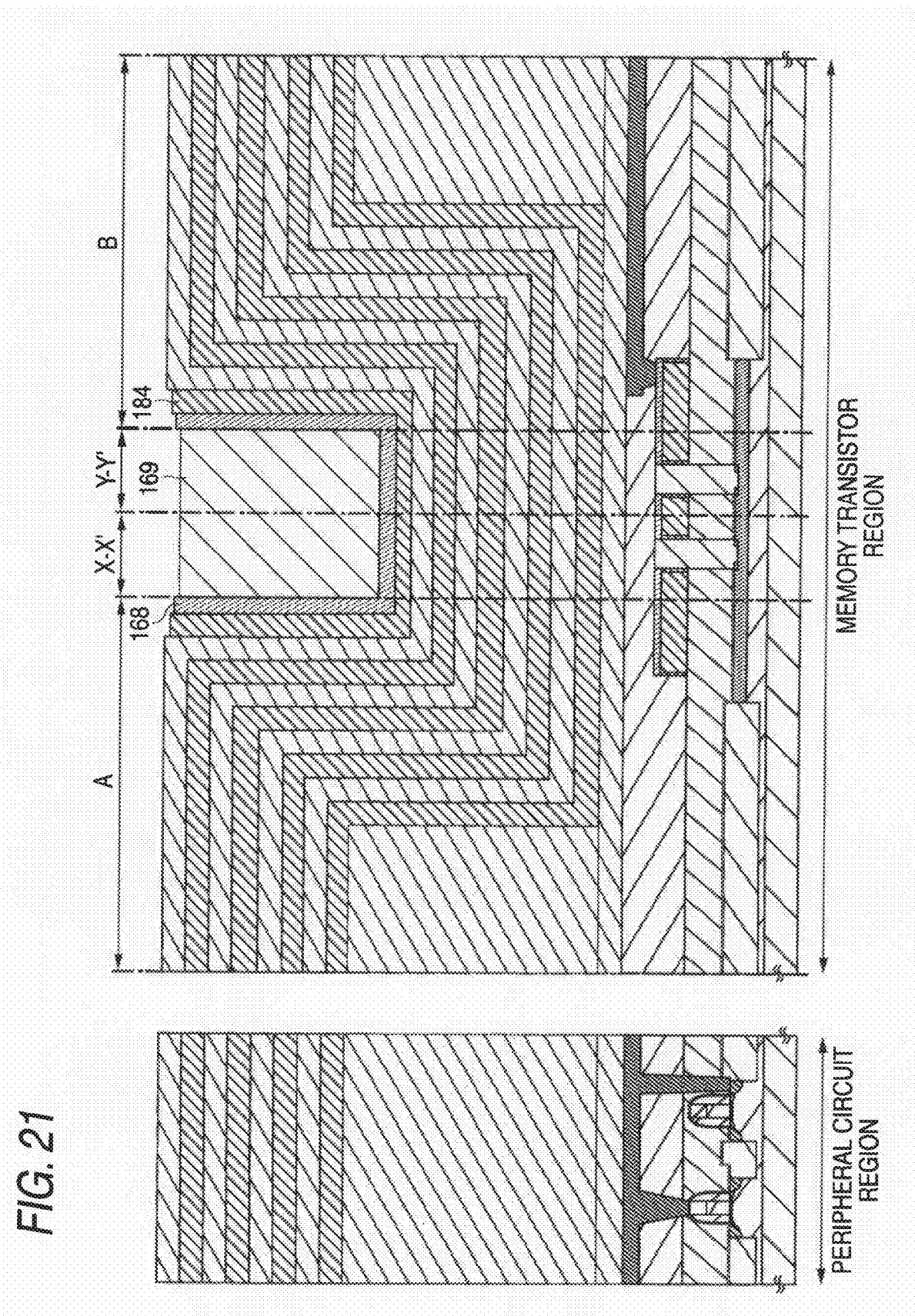
FIG. 21 is a view showing the processes for manufacturing the nonvolatile semiconductor storage device 1 of the first embodiment.
Figure 22:
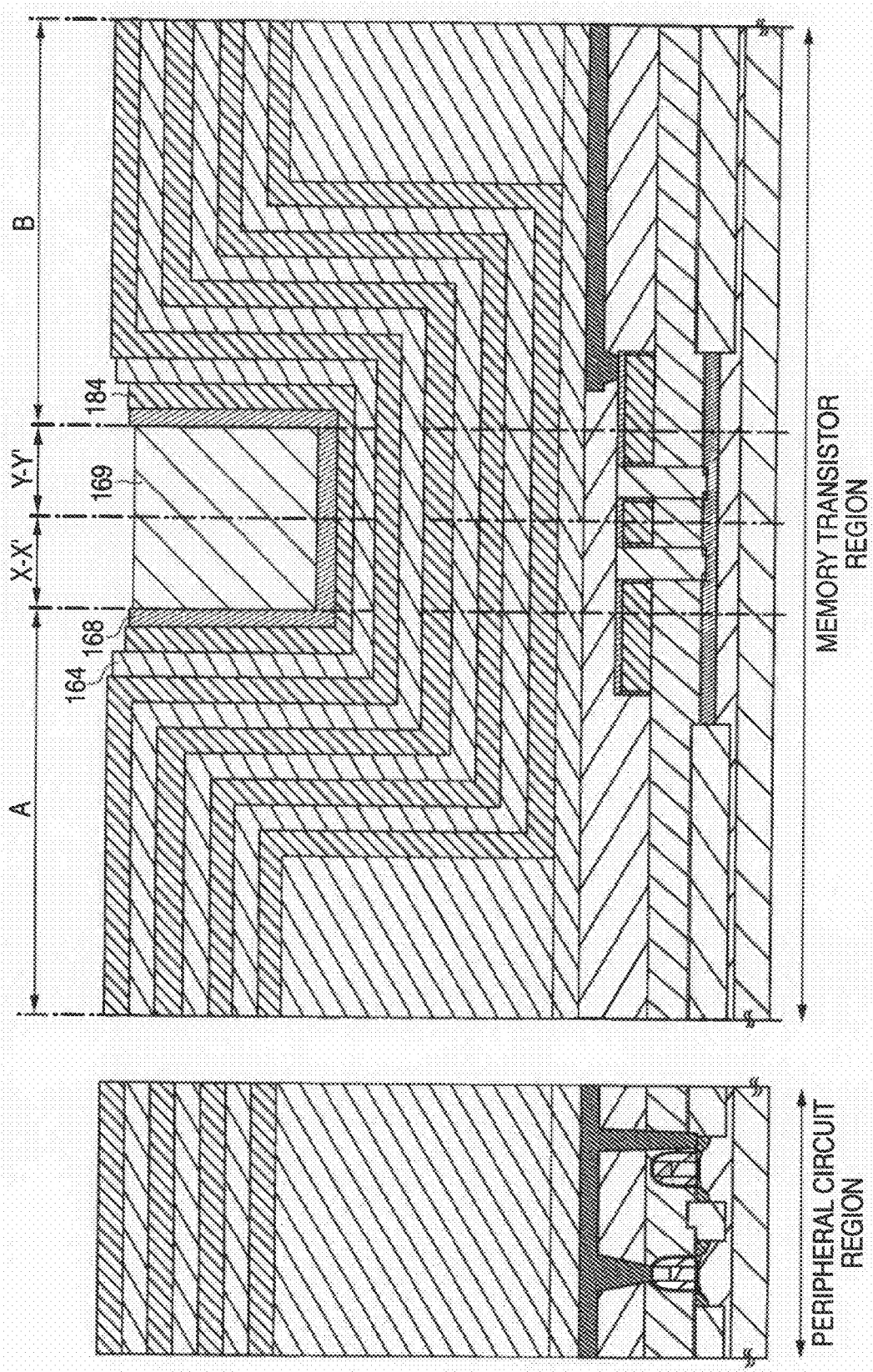
FIG. 22 is a view showing the processes for manufacturing the nonvolatile semiconductor storage device 1 of the first embodiment.
Figure 23:
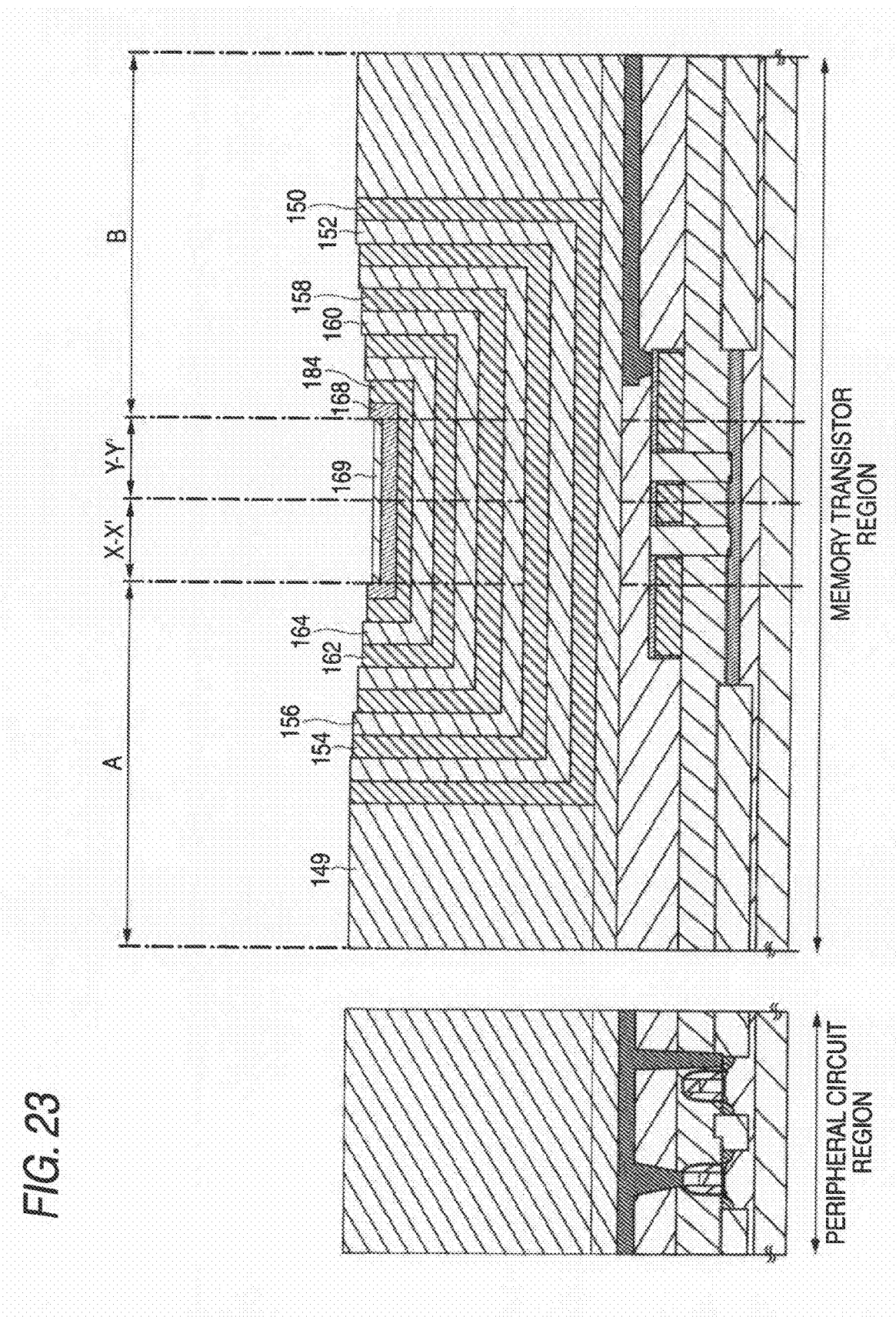
FIG. 23 is a view showing the processes for manufacturing the nonvolatile semiconductor storage device 1 of the first embodiment.

When a hindrance arises in collective planarization of the films deposited into a concave shape by means of CMP (FIG. 13), films from the SOG 169 to the lowermost amorphous silicon film 150 may also be sequentially planarized through well-known anisotropic dry etching. Specifically, the films undergo the following processes. First, the SOG 169 is etched away. The applied SOG 169 still remains in a depression in the concave silicon nitride film 168 stacked at the highest level (FIG. 19). The silicon nitride film 168 is etched back by means of reactive ion etching (RIE), to thus be planarized (FIG. 20). Next, the amorphous silicon film 184 is etched back by means of RIE, to thus be planarized (FIG. 21). Next, the silicon oxide film 164 is etched back by means of RIE, to thus be planarized (FIG. 22). Likewise, the amorphous silicon films (162, 158, 154, and 150) and the silicon oxide films (160, 156, and 152) are sequentially etched back by means of RIE, to thus be planarized. Thereby, the amorphous silicon films, the silicon oxide films, and the silicon nitride film, which are to be stacked, are processed so as to assume plane end faces, respectively (FIG. 23). Since the end faces of the respective layers are anisotropically etched by means of RIE, slight steps arise in the end faces of the respective layers. Hence, the end faces fails to form a perfectly single plane but an essentially-single plane. Via holes for connecting the word-line drive circuit 3 to the respective word lines WL1 to WL4 (7) can be formed by means of single lithography and RIE.

In the nonvolatile semiconductor storage device of the first embodiment, the memory cell layers and the upper select gate layers are collectively formed. Further, the amorphous silicon films, the silicon oxide films, and the silicon nitride film, which are to be stacked, are formed concavely and planarized. Consequently, the planarized end faces of the ends of the respective films form an essentially-single plane. Forming via holes for connecting the word lines WL, or the like, to the respective amorphous silicon films, in a single process is facilitated, and hence the number of manufacturing processes can be cut significantly.

Specifically, a multilayer film corresponding to the number of layers of memory transistors to be stacked and a multilayer film of the upper selection gate layer have been deposited in advance, and hole patterns are formed concurrently. As a result, a plurality of series-connected vertical memory transistors can be formed in one PEP. Further, in order to activate the plurality of series-connected vertical transistors, a selection gate must be connected to the top and bottom of the transistors. As mentioned previously, the upper selection gate is formed along with the memory transistors in a single operation, and a lower selection gate can also be formed concurrently in one or two PEP operations.

According to the nonvolatile semiconductor storage device of the first embodiment and a method for manufacturing the semiconductor storage device, word lines are formed in each layer by means of a common conductor layer, thereby enabling a reduction in the number of word-line drive circuits and a reduction in chip area.

The source-side selection gate lines SGS of the plurality of series-connected vertical transistors and the word lines WL of the respective memory transistors can be operationally brought into a common electric potential in each layer at all times. Therefore, a planar structure can be adopted for both the selection gate liens SGS and the word lines WL. As a result, the word lines can be formed by means of a rough PEP, and simplified manufacturing processes and cost cutting can be materialized.

In the nonvolatile semiconductor storage device of the first embodiment, the amorphous silicon films—which are used for forming the channels of the memory cells and the channels of the upper selection gate transistor SDTr—and the silicon oxide films and the silicon nitride film—which serve as interlayer insulating films—are deposited into a concave shape as mentioned previously. Consequently, the ends of the respective films in the direction perpendicular to the bit lines of the films assume a shape folded upwardly with respect to the substrate. However, in the case where a consideration is given to a reduction in chip area, the ends of the respective films in the direction orthogonal to the bit lines of the films do not necessarily assume a shape upwardly bent with respect to the substrate. The essential requirement is to bend upwardly, with respect to the substrate, only the ends of the films located in the region B shown in FIG. 8. Thus, the region A shown in FIG. 8 can be miniaturized, and an attempt can be made to reduce the chip area.

Figure 27:
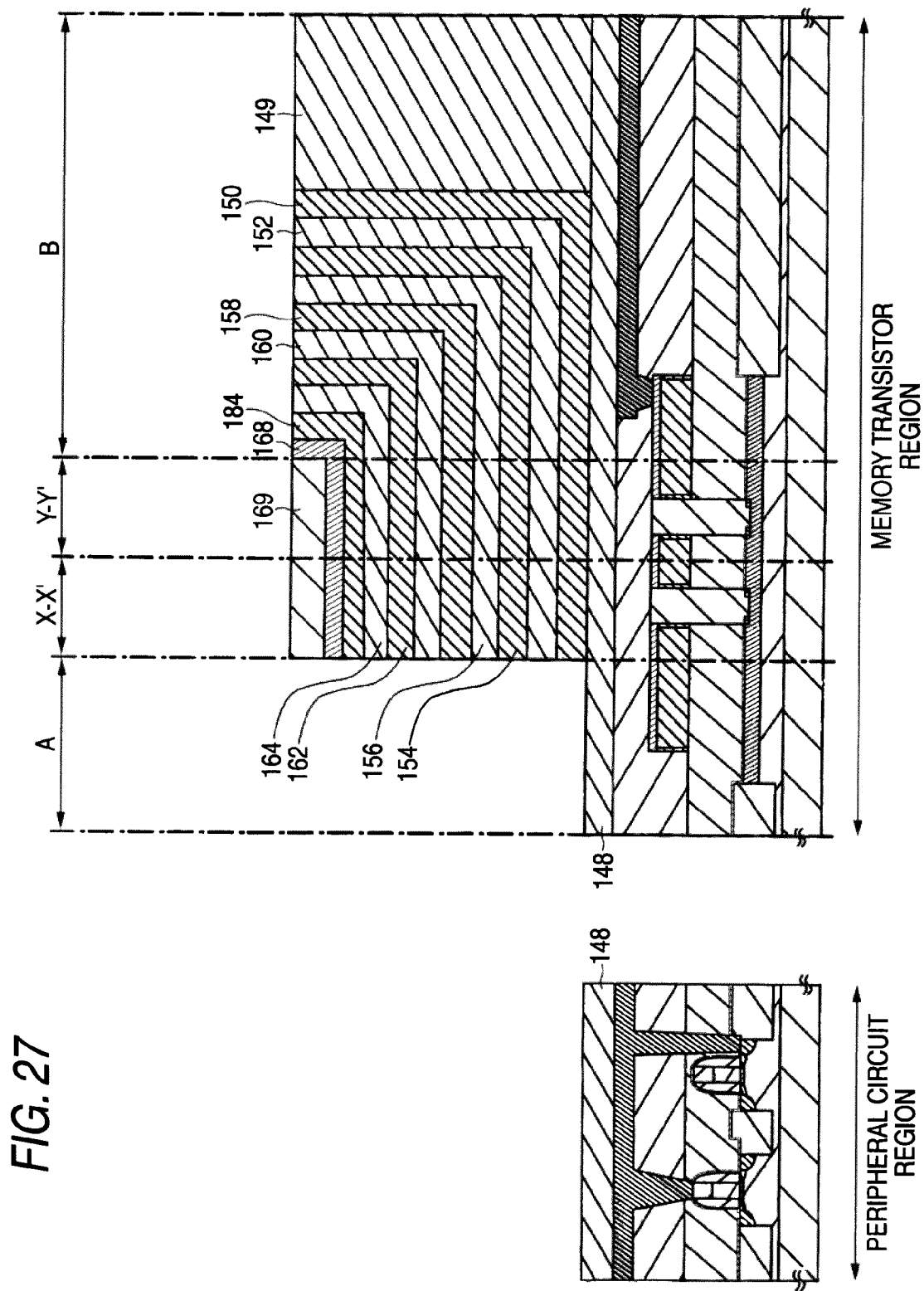
FIG. 27 is a view showing the processes for manufacturing the nonvolatile semiconductor storage device 1 of the first embodiment.

Accordingly, in a modification of the nonvolatile semiconductor storage device of the first embodiment, the amorphous silicon films, the silicon oxide films, and the silicon nitride film—which are to be stacked—two-dimensionally (in a plane direction) spread in the respective memory transistor regions, as shown in FIG. 27. The essential requirement is to upwardly bend, with respect to the substrate, only the ends located in the region B—where via holes connected to the word lines WL are formed—among both ends of the films in the direction orthogonal to the bit lines of the films. Put another way, the films to be stacked one on top of the other may also be stacked into the shape of the letter L in the direction of the region B where the via holes to be connected to the word lines WL are to be formed.

The previously-described method for forming, into the shape of the letter L, respective amorphous silicon films, and the like, to be stacked one on top of the other will be described hereunder. Since the processes (FIG. 9) for forming the lower select gate layer, forming the tungsten plugs and interconnects, and forming the TEOS film are the same as those previously mentioned, and hence their repeated explanations are omitted.

Figure 24:
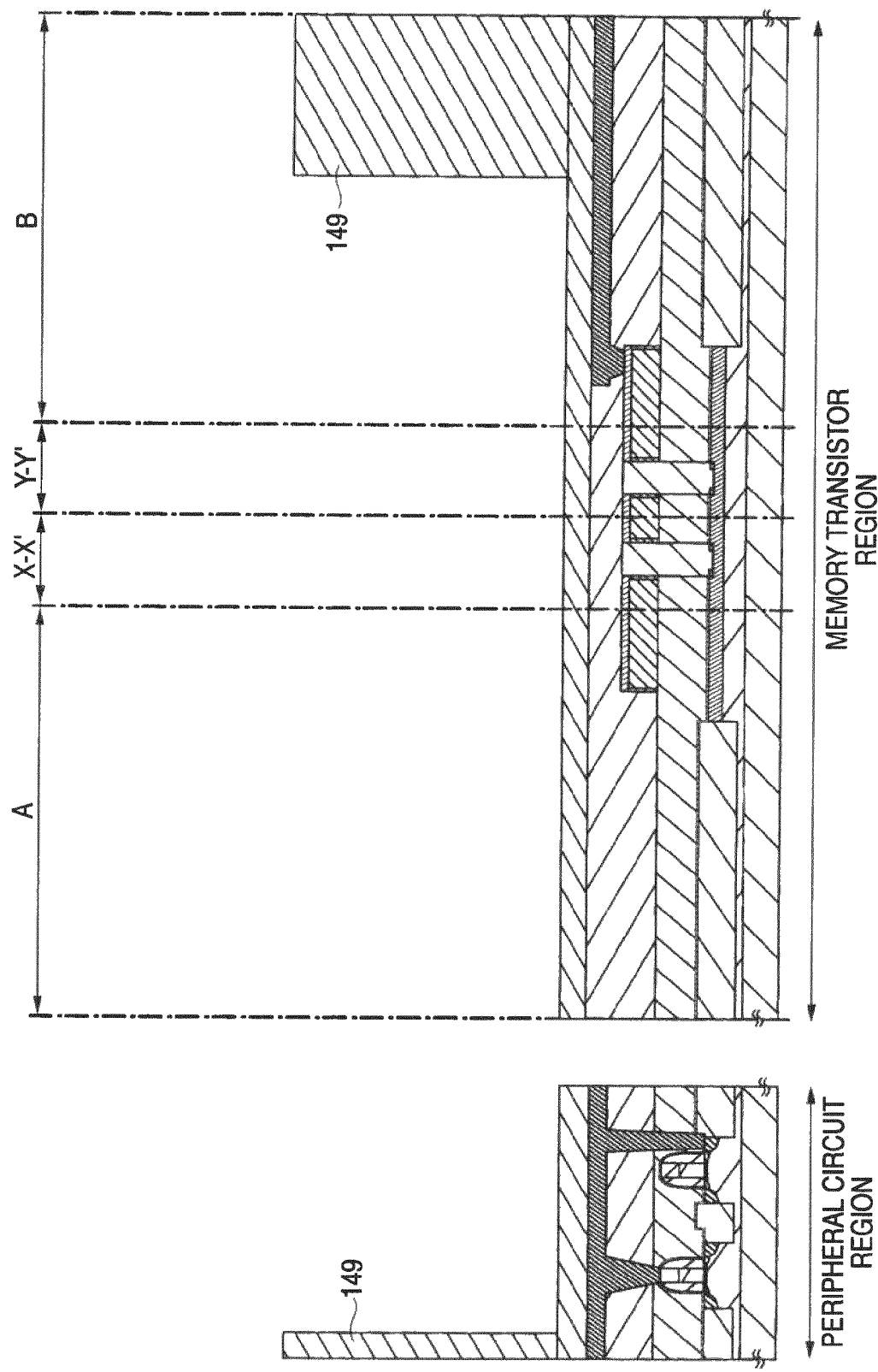
FIG. 24 is a view showing the processes for manufacturing the nonvolatile semiconductor storage device 1 of the first embodiment.

The TEOS film is formed, and the silicon oxide film 149 is deposited, as an interlayer insulating film, over the entirety of the peripheral circuit region and the memory transistor region by means of thermal CVD or plasma CVD. Next, a resist film is formed in a portion of the peripheral circuit region and a region (the region B shown in FIG. 10) where via holes for to be connected to the word lines WL of the memory transistor region, and openings are formed in the resist film by means of anisotropic dry etching (FIG. 24). Through these processes, the silicon oxide film 149 remains in the portion of the peripheral circuit region and the region B. Meanwhile, a portion of the peripheral circuit region close to the memory transistor region, the memory region, and a region (the region A shown in FIG. 10)—where the source-side selection gate lines (SGS) and the drain-side selection gate lines (SGD) are connected—are opened as a result of the silicon oxide film 149 being etched away. Put another way, there is formed a concave shape in which the portion of the peripheral circuit region and the region B are high and where the other portion of the peripheral circuit region, the memory region, and the region A are recessed.

Figure 25:
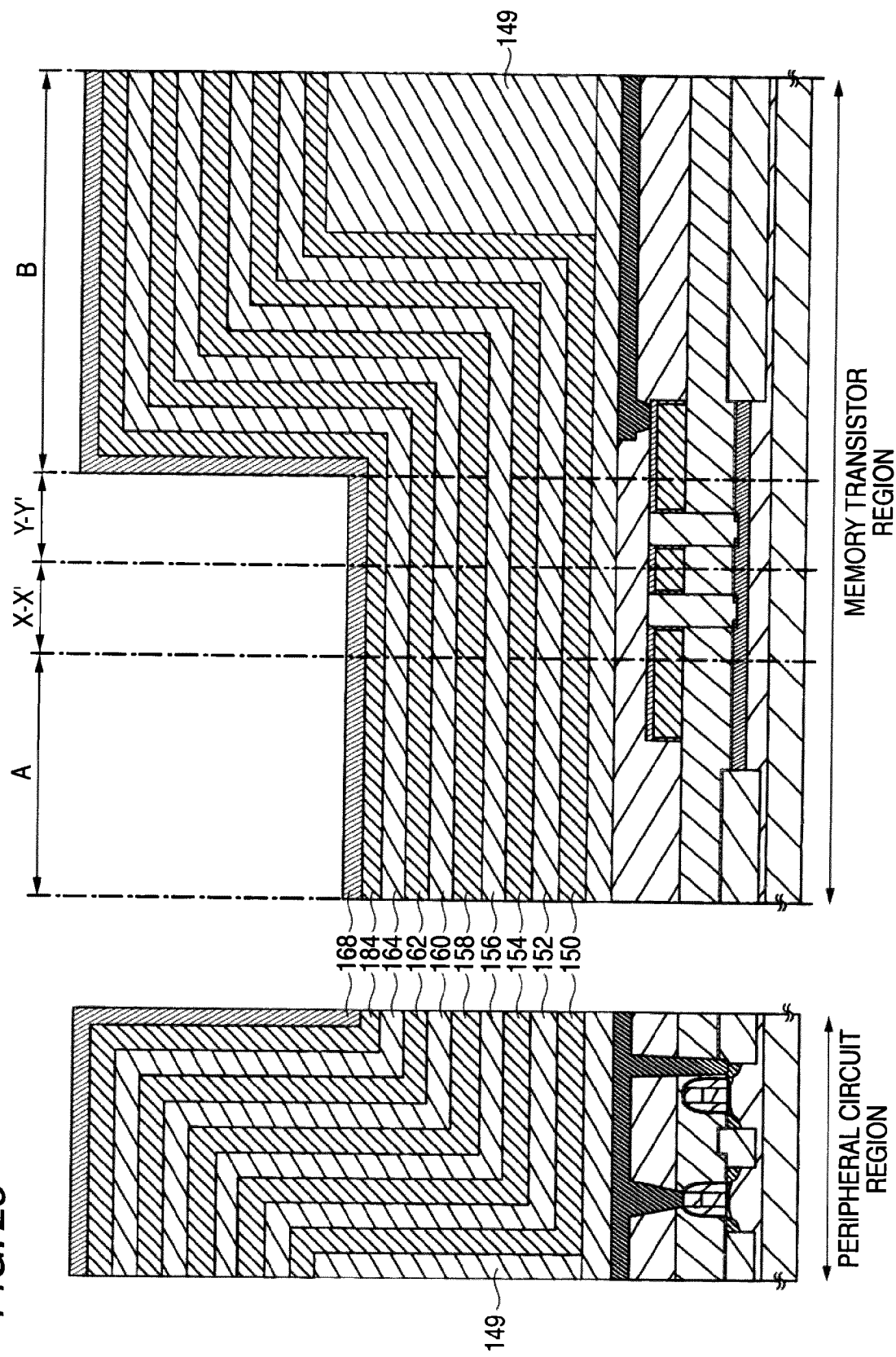
FIG. 25 is a view showing the processes for manufacturing the nonvolatile semiconductor storage device 1 of the first embodiment.

The amorphous silicon films (150, 154, 158, 162, and 184) doped with a conductive impurity, such as P (phosphor), and the silicon oxide films (152, 156, 160, and 164) serving as insulating films sandwiched between control gates are deposited alternately over the entire substrate, and the silicon nitride film 168 is deposited further (FIG. 25). The number of layers into which the amorphous silicon film and the silicon oxide film are stacked is not limited to four. The films are stacked as necessary. By means of stacking operation, the respective amorphous silicon films (150, 154, 158, 162, and 184), the silicon oxide films (152, 156, 160, and 164), and the silicon nitride film 168 are stacked into a concave shape in the portion of the peripheral circuit region close to the memory transistor region and the region B in such a way that ends of the respective films extend in an essentially-vertical direction.

Figure 26:
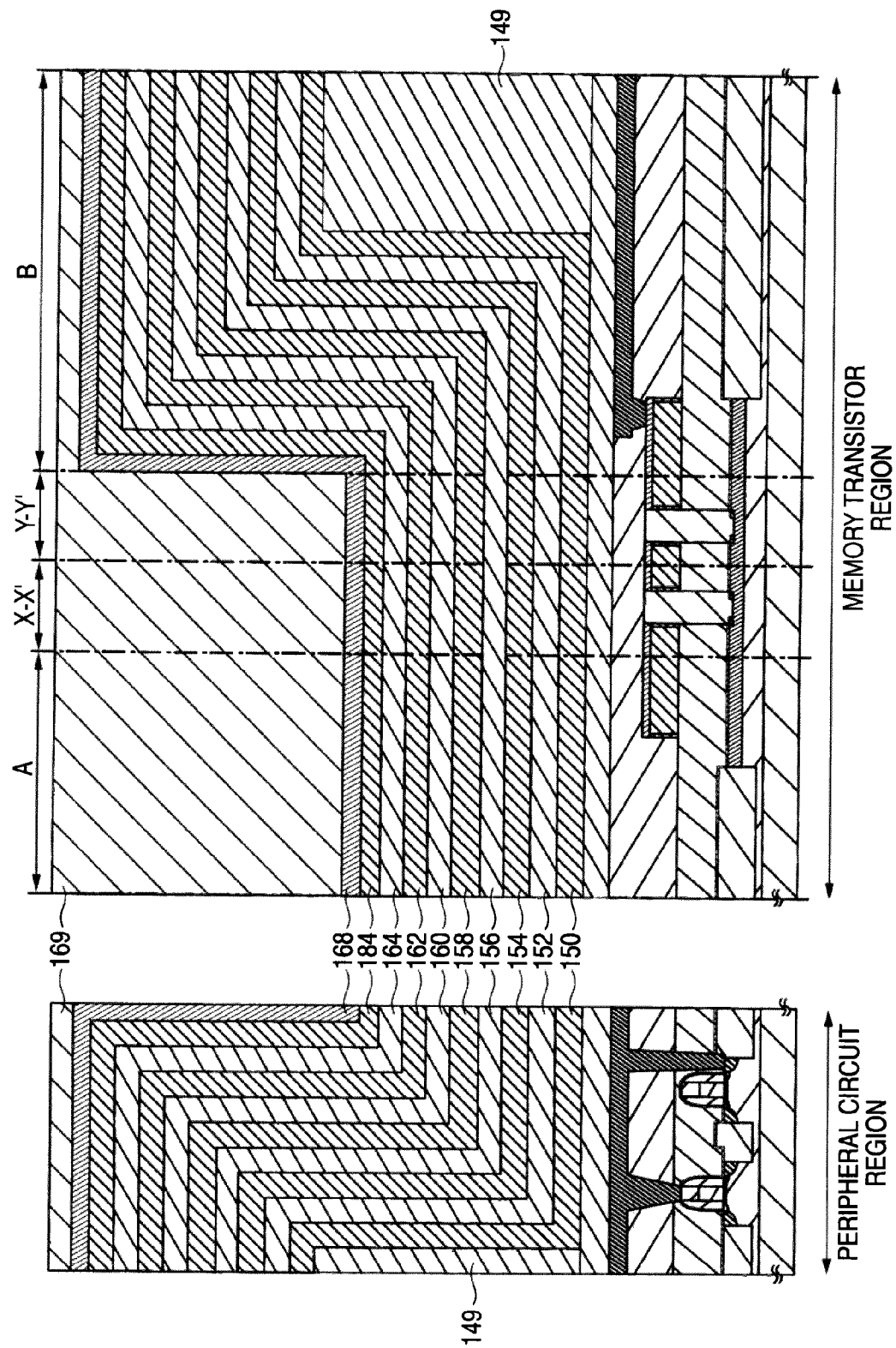
FIG. 26 is a view showing the processes for manufacturing the nonvolatile semiconductor storage device 1 of the first embodiment.

Next, a coating-type low dielectric constant interlayer insulating film SOG (Spin On Glass) 169 is applied and planarized (FIG. 26).

The processes for collectively planarizing the SOG 169 to the stacked lowermost amorphous silicon film 150 through CMP are the same as the previously-described process (FIG. 13) of the first embodiment.

The silicon oxide films (160, 156, 152, and 149), the amorphous silicon films (162, 158, 154, and 150), the silicon nitride film 168, and the SOG 169, all of which still remain in the peripheral circuit region and the region A, are etched away by means of RIE. By means of processing, the lower select gate layer and the TEOS film 148 remain in the peripheral circuit region and the region A. In the meantime, the respective stacked films remain in a planar shape in the memory region, and the films remain bent upwardly with respect to the substrate in the region B, whereupon the films assume the shape of the letter L in the memory transistor region (FIG. 27). Since the following processes are the same as those of the first embodiment, their repeated explanations are omitted.

In the nonvolatile semiconductor storage device of the first embodiment manufactured through the foregoing processes, the memory cell layers and the upper select gate layer are collectively formed in a single process. Among the ends of the respective stacked films in a direction orthogonal to the bit lines of the films, the ends close to the region B where the via holes to be connected to the word-line drive circuits, or the like, are bent upwardly with respect to the substrate and planarized by means of CMP, or the like. Accordingly, the via holes can be readily formed in a single process. From the above descriptions, the present embodiment is additionally provided with one process of eliminating the amorphous silicon films, the silicon oxide films, and the silicon nitride film stacked in the peripheral circuit region by means of CMP (FIG. 27). However, one end of the concave shape is formed so as to stretch from the region A to the peripheral circuit region, and the portion of the peripheral circuit region is etched way in a subsequent process. Hence, the region A can be reduced to the minimum required size. According to the embodiment, as the number of films, such as amorphous silicon layers, to be stacked increases, a chip size is reduced.

Second Embodiment

In the previously-described nonvolatile semiconductor storage device of the first embodiment, ends of the amorphous silicon films, the silicon oxide films, and the silicon nitride film—which are to be stacked—in the direction orthogonal to bit lines are formed so as to be bent upwardly with respect to the substrate. The ends are planarized by means of CMP or the like. Accordingly, as mentioned previously, via holes for use in connection with the word-line drive circuits are readily formed in the end faces of the ends of the respective films in one process.

When the ends of the respective films are formed so as to become bent upwardly with respect to the substrate, the ends are planarized by means of CMP, or the like, so as to assume end faces. As a result, the width of the end face in a direction orthogonal to the bit line becomes equal to the thickness of each of the stacked films. Accordingly, when the via holes are formed in such a narrow area by means of dry etching, the diameter of the via holes is limited to the thickness (the height) of the amorphous silicon film or less. Further, the pitch cannot be set to a size which is greater than the thickness (height) of the silicon oxide film. Therefore, when there is a necessity for ensuring a large diameter of a via hole or when via holes are formed at a greater pitch, increasing the thickness (height) of the amorphous silicon films or the silicon oxide films to be stacked is considered. However, the film thickness is determined from a device characteristic and cannot be changed readily.

In a nonvolatile semiconductor storage device of a second embodiment, while an attempt is being made to miniaturize the entire chip, end faces of planarized amorphous silicon films are formed such that the width of the end faces in the direction orthogonal to the bit line becomes equal to or greater than the thickness (height) of the entire stacked films. As a result, via holes can be accurately formed in a target amorphous silicon film.

Figure 28:
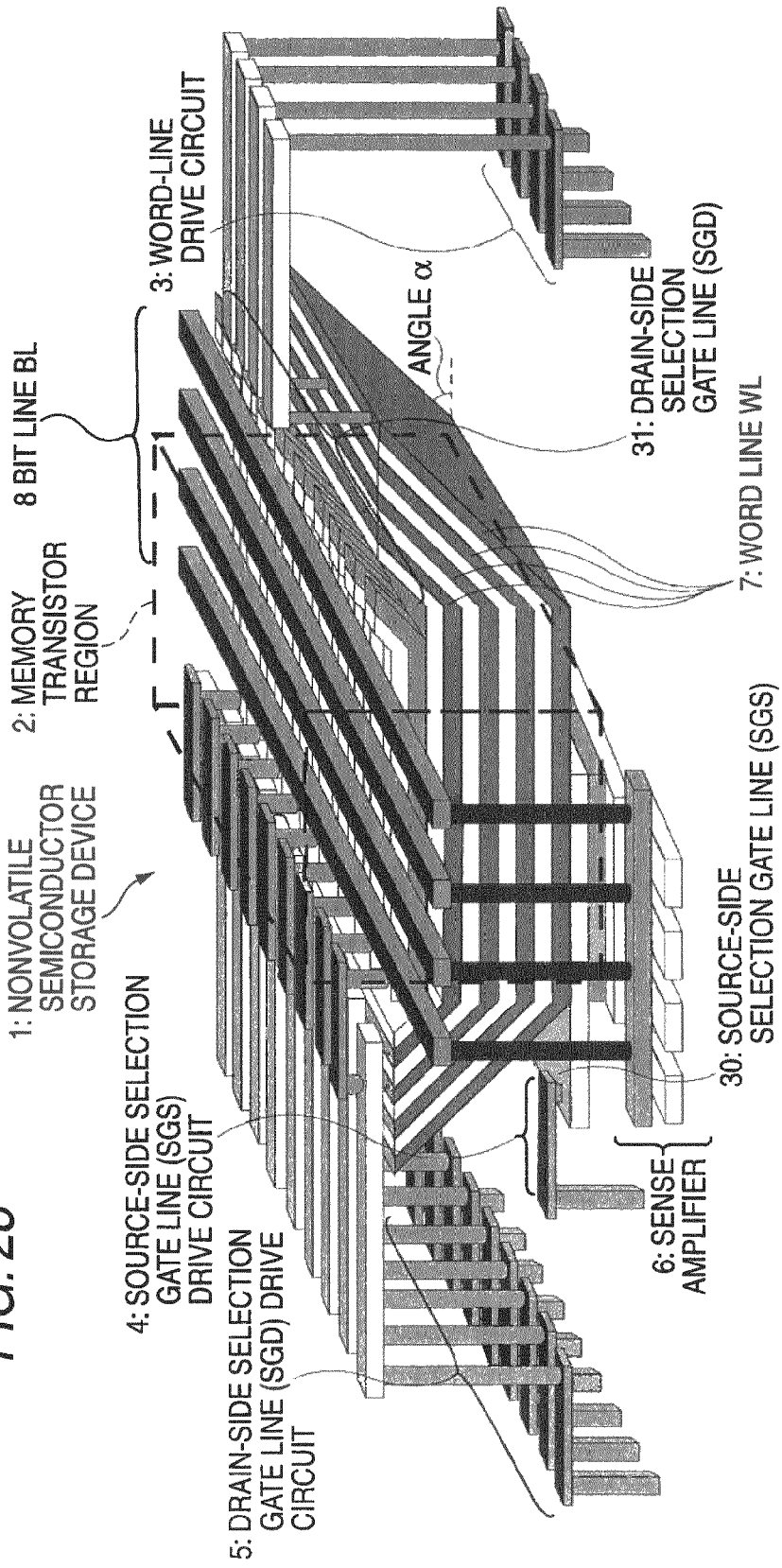
FIG. 28 shows a bird's-eye view of the nonvolatile semiconductor storage device 1 of a second embodiment.
Figure 29:
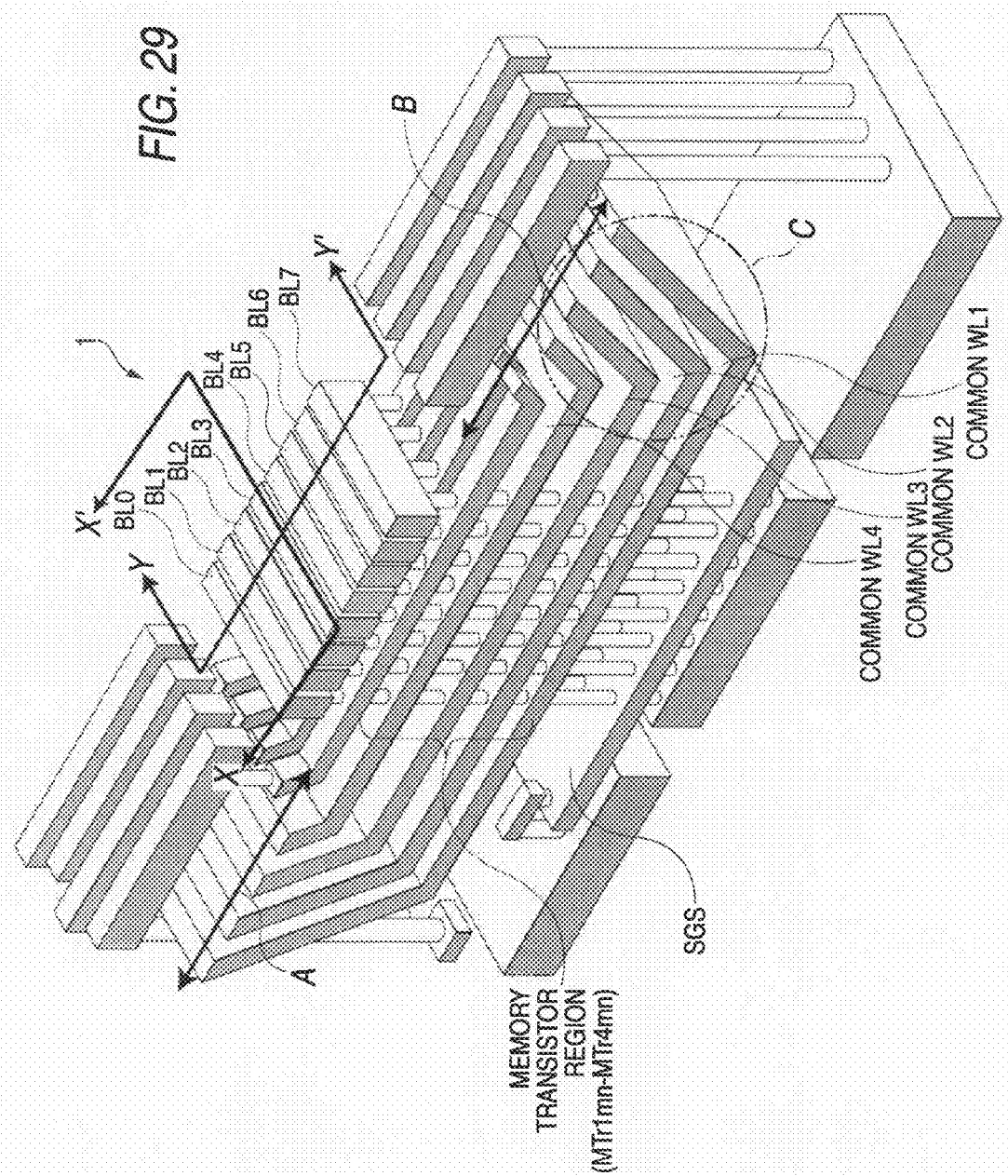
FIG. 29 is a diagrammatic perspective view of the nonvolatile semiconductor storage device 1 shown in FIG. 28.
Figure 30:
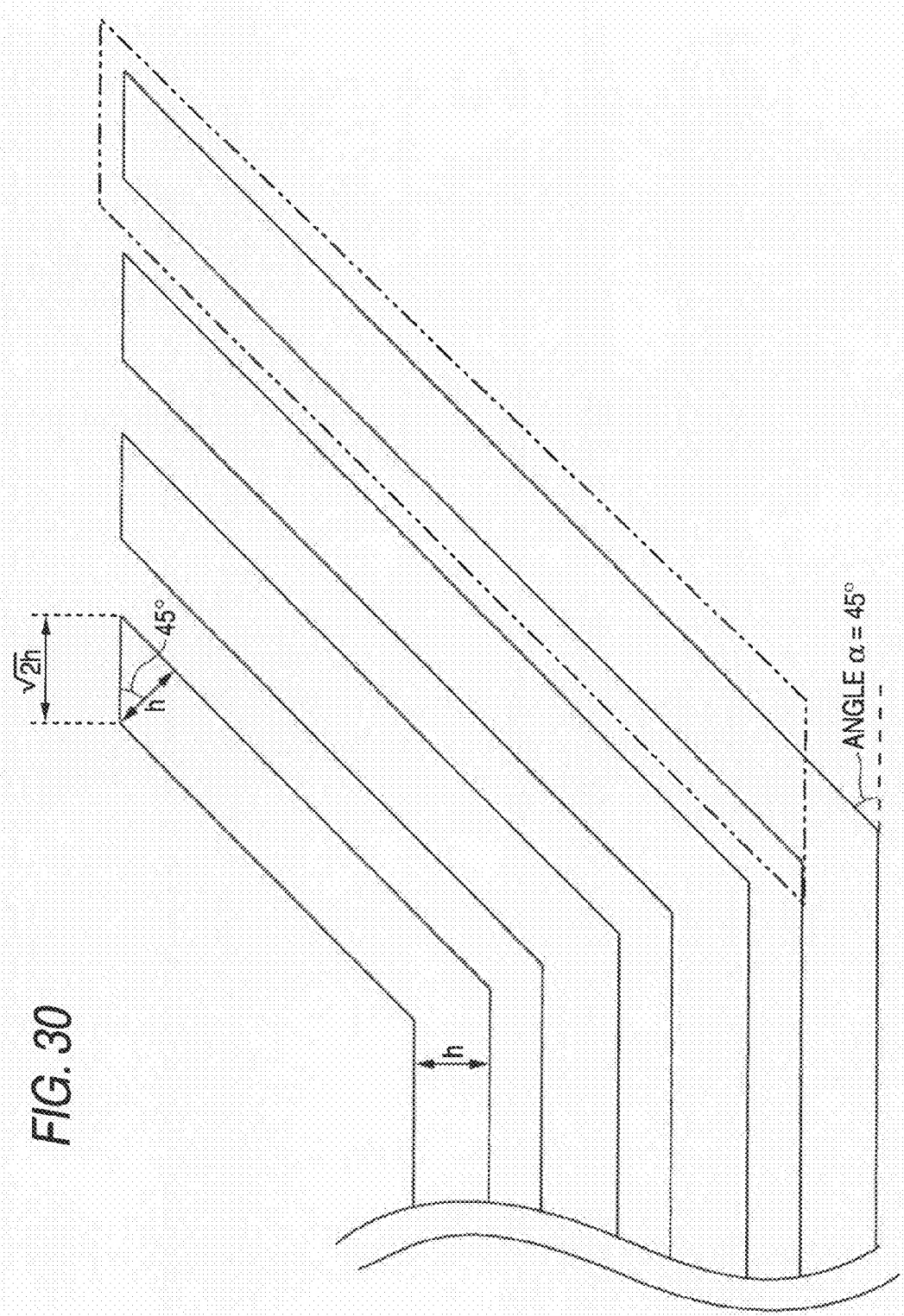
FIG. 30 is an enlarged cross-sectional schematic view of a portion C shown in FIG. 29.

A nonvolatile semiconductor storage device 1 of the second embodiment will be described by reference to the drawings. FIG. 28 is a bird's-eye view of the nonvolatile semiconductor storage device 1 of the second embodiment. FIG. 29 is a diagrammatic perspective view of the nonvolatile semiconductor storage device 1 shown in FIG. 28. FIG. 30 is a diagrammatic enlarged cross-sectional view of a portion C shown in FIG. 29. As shown in FIGS. 28 and 29, as in the case of the first embodiment, the respective word lines WL1 to WL4 (7) two-dimensionally spread in the memory region. Ends of the respective word lines WL1 to WL4 (7) in the direction orthogonal to the bit line are bent upwardly with respect to the substrate and planarized so as to assume planar end faces. In contrast with the first embodiment, the second embodiment is characterized in that an angle α at which the ends are bent upwardly is smaller than aright angle to the substrate; namely, the ends are bent upwardly in an inclined manner with respect to the substrate, and that the respective word lines WL1 to WL4 (7) are formed into a shape whose opening is wider than the opening of the concave shape. Specifically, a polysilicon film to serve as a word-line electrode (or an amorphous silicon film may also be adopted) and an interlayer insulating film are stacked one on top of the other, and ends of the respective layers in the direction orthogonal to the bit lines of the respective layers are bent upwardly in an inclined manner with respect to the substrate, whereupon an opening becomes wider with respect to the planar bottom when compared with the opening of the concave shape. Further, the ends are planarized by means of CMP so as to assume more planar end faces. Hence, via holes for connecting the word-line drive circuits 3 to the respective word lines WL1 to WL4 (7) can be processed in a single photo engraving process. In the following descriptions, an explanation is given to a case where the predetermined angle α is 45° with respect to the substrate. However, the angle is not limited to this numeral and may also be arbitrarily set to an angle which is smaller than the right angle.

As mentioned above, the amorphous silicon films, the silicon oxide films, and the silicon nitride film—which are to be stacked—are formed such that an opening section becomes wider with respect to the planar bottom when compared with the opening section of the concave shape. Accordingly, as shown in FIG. 29, when the ends in the direction orthogonal to the bit line, which are bent upwardly with respect to the substrate, are planarized, the width of the planarized ends in the direction orthogonal to the bit line becomes greater than the thickness (height) of each of the films. Since the upper faces of the ends extended upwardly with respect to the substrate are planarized, the cross-sectional profile of the end assumes the shape of a parallelogram. The width of the end face in the direction orthogonal to the bit line, which corresponds to one side of the parallellogram, is greater than the thickness of the film corresponding to the height of the parallelogram. Specifically, as shown in FIG. 30, when the respective films are bent upwardly at an angle of; e.g., 45°, the width of the planarized end face in the direction orthogonal to the bit line comes to √2 h on the assumption that the height (thickness) of each of the films is taken as "h."

The width of the end face in the direction orthogonal to the bit line is determined according to the angle α with respect to the substrate at which the end is bent upwardly. When the angle α is set to an angle close to the right angle; e.g., 85°, the width of the end face in the direction orthogonal to the bit line is essentially the same as the thickness of the film. When the angle α is set to an angle close a level; e.g., 5°, the width of the end face in the direction orthogonal to the bit line becomes great extremely. There arises a necessity for greatly ensuring the region B where via holes for connection with the word lines WL, or the like, are to be formed, which is contrary to a tendency toward a smaller chip size. Therefore, the angle α with respect to the substrate at which the ends are bent upwardly is determined according to the size and pitch of a required via hole, the thickness (height) of each of the stacked films, and the size of the region B. In general, the angle α is smaller than 80° with respect to the substrate; for example, 45°. In this case, as shown in FIG. 30, the width of the end face in the direction orthogonal to the bit line comes to √2 times (about 1.41 times) as large as the thickness "h" of the film corresponding to the height. Accordingly, the size of the via hole can be increase. Further, a pitch having an allowance can be set.

FIGS. 31 through 35 are views showing processes for manufacturing the nonvolatile semiconductor storage device of the second embodiment. In FIGS. 31 through 35, word-line drive circuits and the peripheral circuit region where peripheral circuits, such as sense amplifier circuits, are formed and shown on the left side; and the memory transistor region is shown on the right side. The region A, the region B, and areas corresponding to cross sections X-X' and Y-Y' in the nonvolatile semiconductor storage device 1 of the second embodiment shown in FIG. 29 are illustrated in the memory transistor region.

Processes from the process for forming element isolation regions STI 102a, 102b, 102c, 102d, and 102e on the semiconductor substrate to the process (FIG. 9) for forming the TEOS film 148 over the entire substrate by mean of known CVD are analogous to those described in connection with the first embodiment, and their repeated explanations are omitted.

Figure 31:
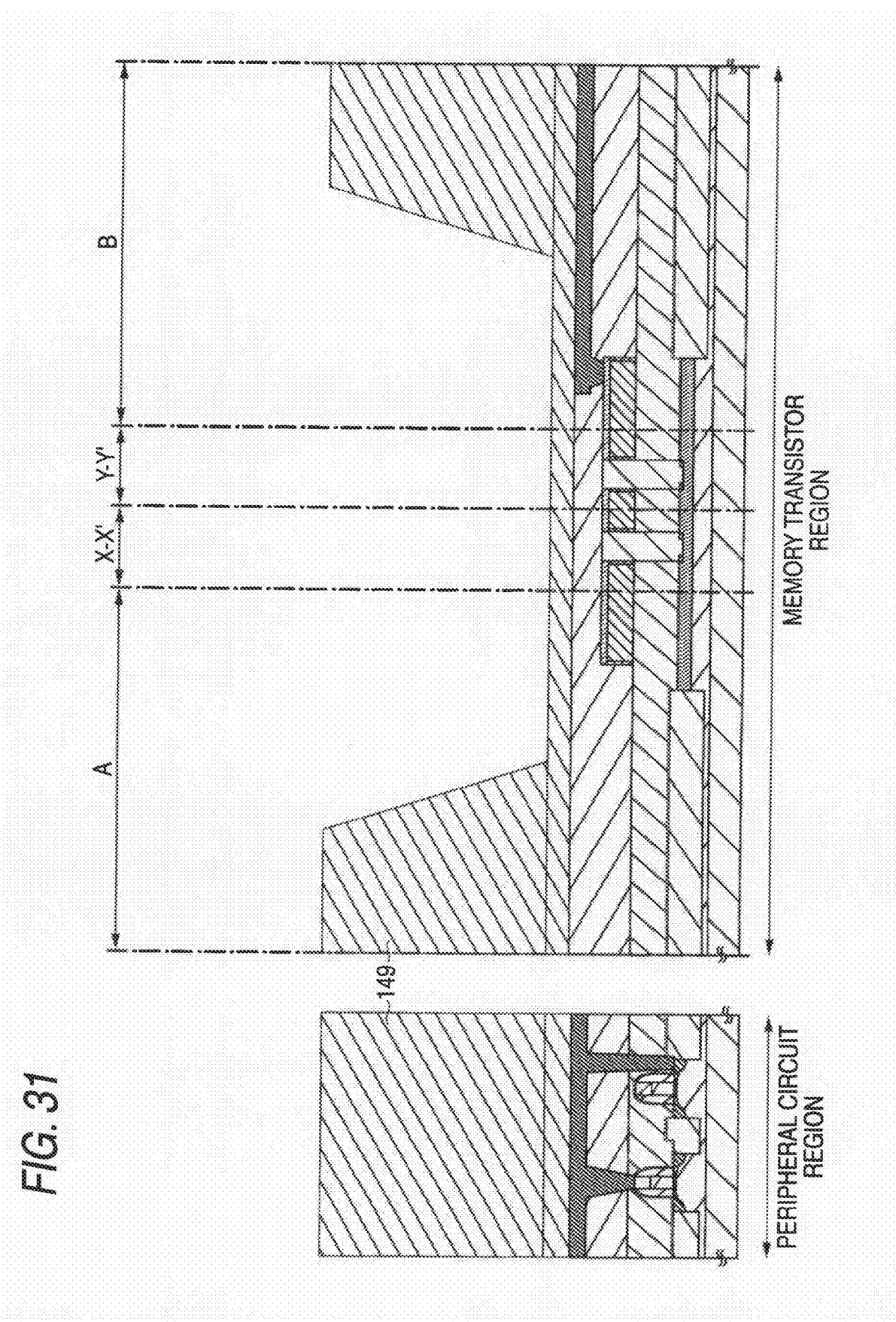
FIG. 31 is a view showing processes for manufacturing the nonvolatile semiconductor storage device 1 of the second embodiment.

Subsequent to formation of the TEOS film 148, a silicon oxide film 149 is deposited as an interlayer insulating film by means of thermal CVD or plasma CVD. Next, a resist film (not shown) used for forming an opening is formed in an area other than the memory region such that the films are deposited in an essentially-horizontal position in the memory region, in consideration of the entire height (thickness) of the films to be deposited. The silicon oxide film 149 is removed by means of anisotropic dry etching, to thus create an opening (FIG. 31). Here, when compared with the first embodiment, the nonvolatile semiconductor storage device 1 of the second embodiment is characterized in that the deposited silicon oxide film 149 is taper-etched. Specifically, when the silicon oxide film 149 is anisotropically etched, etching is not carried out in a direction perpendicular to the substrate but at a predetermined angle with respect to the substrate. The predetermined angle is determined according to the size and pitch of a required via hole, the thickness (height) of each of films to be stacked, and the size of the region B; and is set to an angle smaller than; e.g., 80°. An example in which settings are made such that an angle of 45° is made with respect to a substrate. Through this process, the upper surface of the substrate on which the remaining silicon oxide film 149 and the TEOS film 148 are deposited is formed into a shape whose opening is wider than the concave shape (in other words; a tapered shape).

Figure 32:
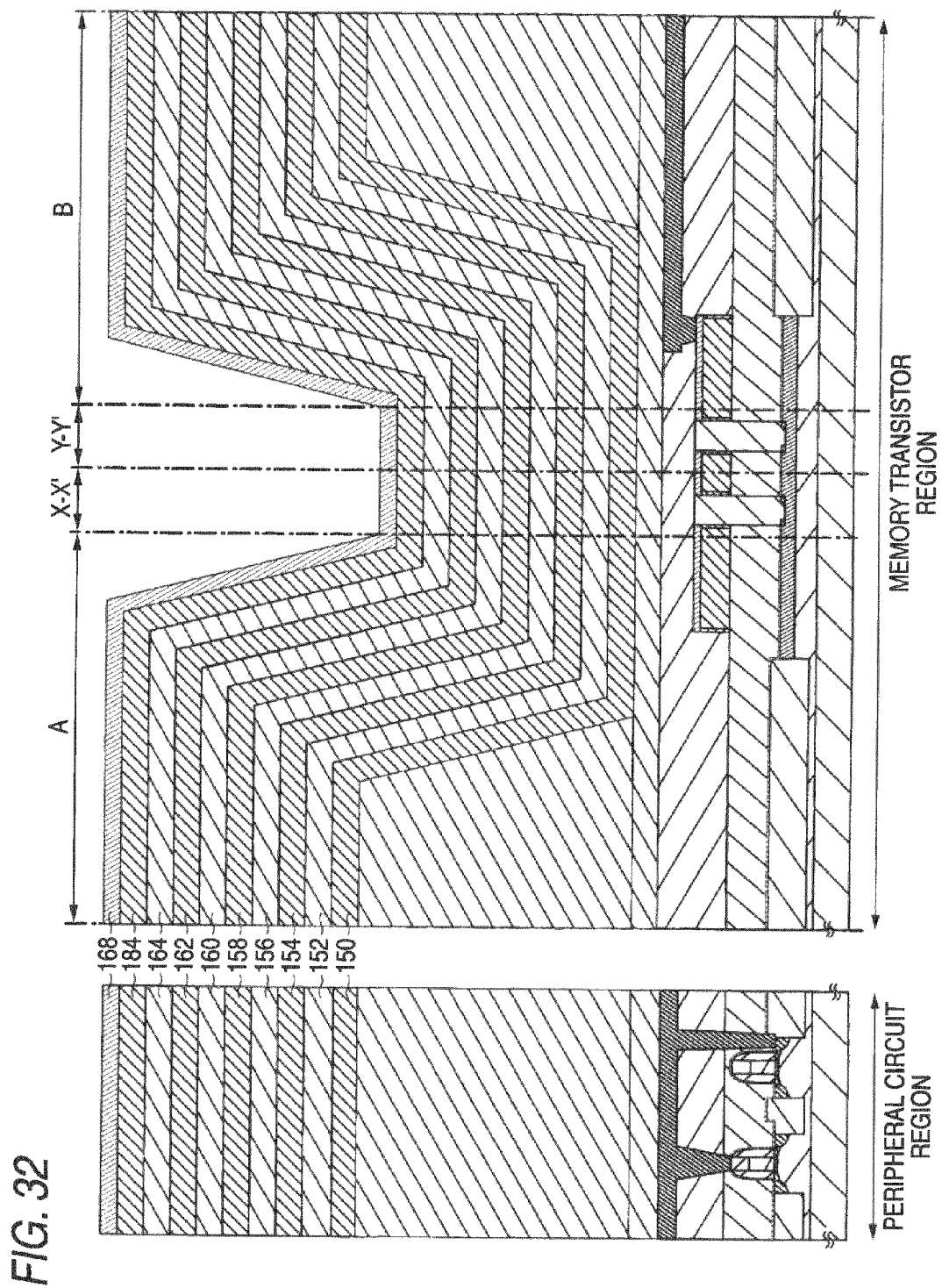
FIG. 32 is a view showing the processes for manufacturing the nonvolatile semiconductor storage device 1 of the second embodiment.

An amorphous silicon film (or a polysilicon film) doped with a conductive impurity, such as P (phosphor), and the silicon oxide film serving as an insulating film between control gates are deposited alternately, thereby forming the amorphous silicon films 150, 154, 158, 162, and 184 and the silicon oxide films 152, 156, 160, and 164. Moreover, the silicon nitride film 168 is formed (FIG. 32).

At this time, the memory region is opened, by means of the foregoing processes, into a shape whose opening is wider than the opening of the concave shape. The films are deposited so as to become folded along the sidewall of the opening, as well as being deposited on the bottom of the opening horizontally with respect to the substrate. Accordingly, the respective films to be stacked are deposited into a shape whose opening is wider than the opening of the concave shape (FIG. 32). Put another way, the respective films are formed into a shape which is bent upwardly with respect to the substrate.

Figure 33:
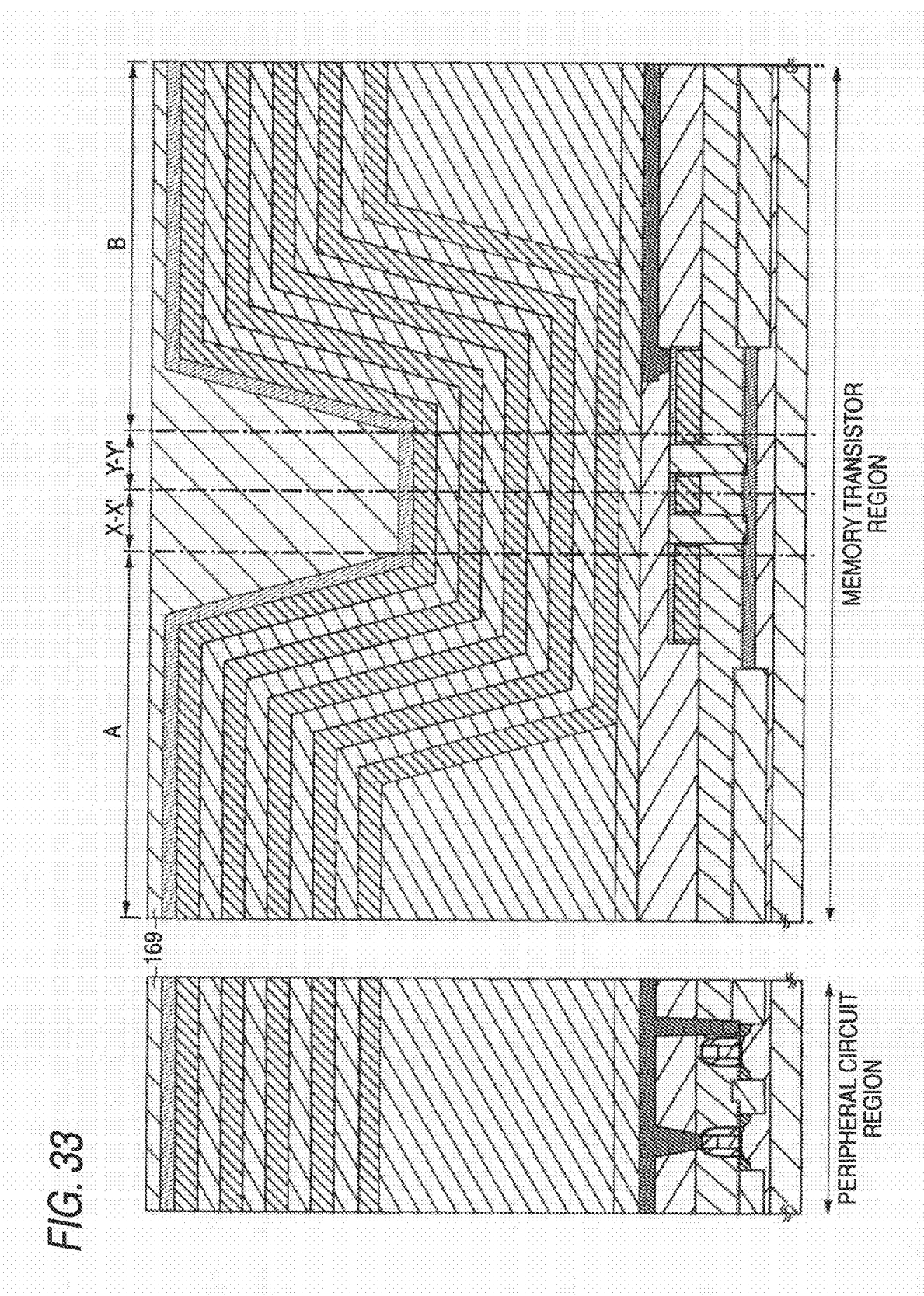
FIG. 33 is a view showing the processes for manufacturing the nonvolatile semiconductor storage device 1 of the second embodiment.

A coating-type low dielectric interlayer insulating film SOG (Spin On Glass) 169 is applied and planarized (FIG. 33).

Figure 34:
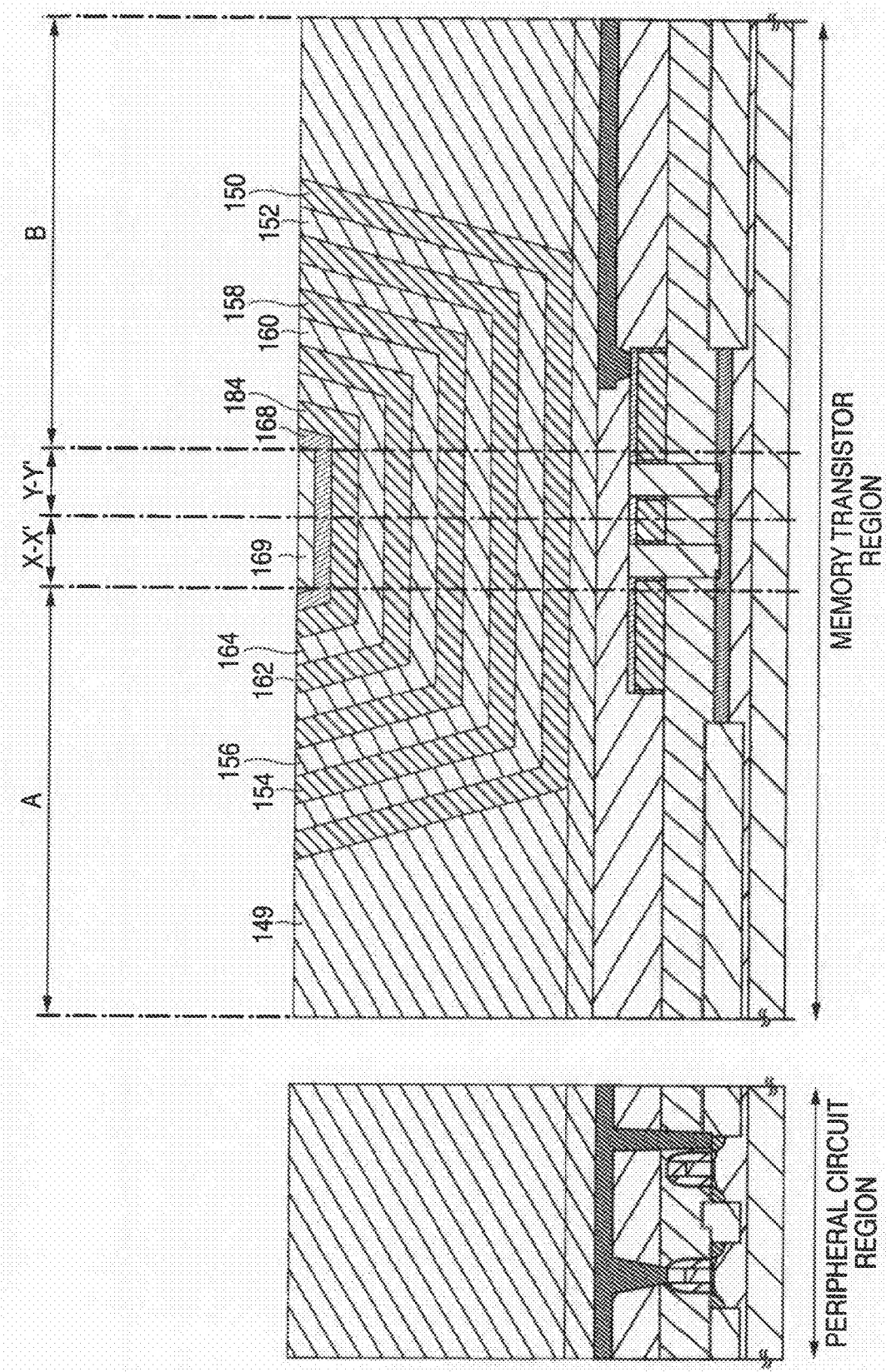
FIG. 34 is a view showing the processes for manufacturing the nonvolatile semiconductor storage device 1 of the second embodiment.

Films from the SOG 169 to the lowermost stacked amorphous silicon film 150 are planarized in one operation by means of a CMP treatment (FIG. 34).

Processes (FIG. 15)—from the process for forming the memory plug holes (FIG. 14) to the process for forming interconnect via holes 400a for the peripheral circuits by means of PEP and RIE after formation of the columnar amorphous silicon layer 180 (the second columnar semiconductor) which is to serve as channel sections of the memory cells and channel sections of the upper selection gate transistors SDTr—are the same as the method for manufacturing the nonvolatile semiconductor storage device of the first embodiment. Hence, their repeated explanations are omitted.

Figure 35:
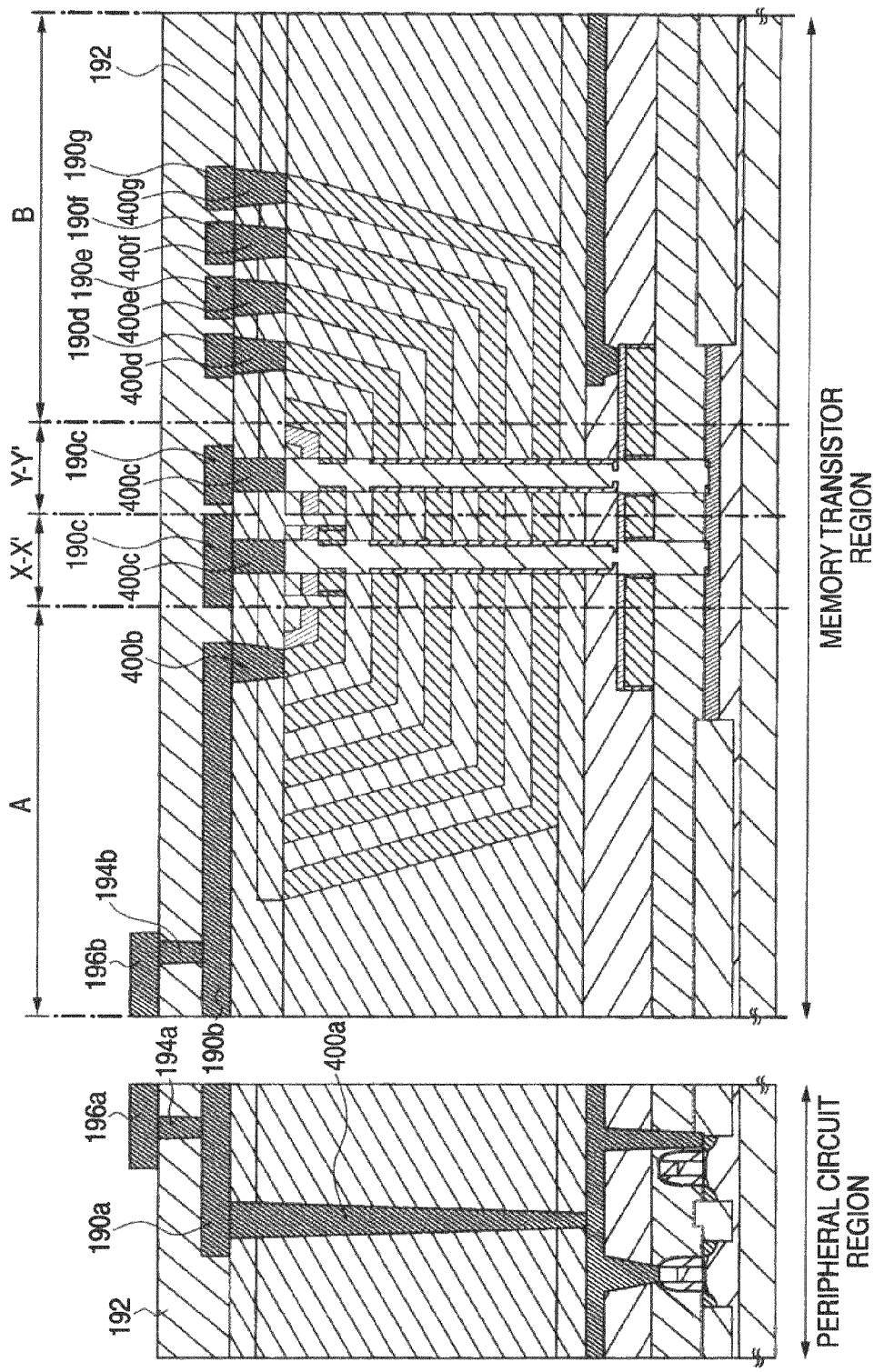
FIG. 35 is a view showing the processes for manufacturing the nonvolatile semiconductor storage device 1 of the second embodiment.

Next, the via holes 400b, 400c, 400d, 400e, 400f, and 400g of the memory transistor region are formed in one operation by means of PEP and RIE (FIG. 35). The amorphous silicon films (162, 158, 154, and 150) to which the via holes 400d to 400g are connected are deposited into such a shape that the opening section is opened at an angle of 45° with respect to the substrate, and the amorphous silicon films are subsequently planarized by means of CMP so as to become horizontal with respect to the substrate. Accordingly, the width of end faces of the planarized ends in the direction orthogonal to the bit line has become greater than the thickness (height) of the respective deposited films. Consequently, via holes are formed in the end faces having a large width, and hence the via holes can be created with a greater allowance when compared with the case where the via holes are created by means of the manufacturing method described in connection with the first embodiment. Moreover, the diameter of the via holes can be formed large. Further, the width of the end faces of the silicon oxide films (164, 160, 156, and 152) formed between the amorphous silicon films is also made large for the same reason. Therefore, the pitch between the via holes can be ensured greater that achieved under the manufacturing method of the first embodiment.

Processes from the process (FIG. 17) for forming the tungsten plugs 188a to 188g to the process (FIG. 18) for finally forming the tungsten plugs 194a and 194b and aluminum electrodes 196a and 196b are analogous to the counterpart processes of the manufacturing method of the first embodiment, and hence their repeated explanations and illustrates are omitted. Through the foregoing processes, the nonvolatile semiconductor storage device of the second embodiment can be manufactured.

Even in the nonvolatile semiconductor storage device of the second embodiment, the essential requirement is that, among the ends of the conductor layers—which are to serve as word-line electrodes—in the direction orthogonal to the bit line, only the ends located in the region B—where via holes for connection with the word-line drive circuits are to be formed—be formed so as to be bent upwardly with respect to the substrate. Thus, the region A shown in FIG. 28 can be reduced, and an attempt can be made to reduce the chip area. In this regard, the second embodiment is the same as the first embodiment, and a manufacturing method is also completely identical with that of the first embodiment, and hence their repeated explanations are omitted.

In the nonvolatile semiconductor storage device of the second embodiment, via holes can be formed with allowance in respective conductor layers which are to serve as word-line electrodes. Moreover, the size of the via holes can also be increased. In addition, the pitch among the via holes can also be ensured greatly.

In the nonvolatile semiconductor storage device of the second embodiment, the memory cell layers and the upper select gate layer are formed in one operation, and ends of the respective layers in the direction orthogonal to the bit lines of the respective layers are bent upwardly at a predetermined angle with respect to the substrate and planarized. Accordingly, forming via holes for connection with the word lines WL, and the like, in the respective amorphous silicon films in a single process is facilitated, and hence the number of manufacturing processes can be cut significantly.

Moreover, in the nonvolatile semiconductor storage device of the second embodiment, word lines are formed, on each layer, by means of a common conductor layer, whereby the number of word-line drivers can be reduced and a smaller chip area can be realized.

Furthermore, the selection gate lines SGS and the word lines WL can be operationally brought into a common electric potential on each layer at all times. Further, a planar structure can be adopted in any of predetermined regions. As a result, the word lines can be formed by means of a rough PEP, whereby manufacturing processes are simplified and cost cutting can be embodied.

Although the present invention has been described in the descriptions of the first and second embodiments thereof, it should not be understood that the description and the drawings constituting a part of the disclosure of the present invention limit this invention. Various alternative embodiments, examples and operation techniques will become apparent from this disclosure to those skilled in the art.

For example, the ends of the amorphous silicon films (or may also be polysilicon films) functioning as word-line electrodes may have a smoothly curved shape, and it is not necessary to have a straight shape.

According to an aspect of the present invention, there is provided a nonvolatile semiconductor storage device which includes three-dimensionally stacked memory cells and which cuts the number of processes for processing contacts into word-line electrodes, to thus curtail cost.

What is claimed is:

1. A nonvolatile semiconductor storage apparatus comprising:
   a substrate;
   an insulating layer disposed on the substrate;
   a columnar semiconductor disposed perpendicular to the substrate;
   a laminated film comprising:
      a first insulating film disposed around the columnar semiconductor,
      a charge storage film disposed around the first insulating film, and
      a second insulating film disposed around the charge storage film;
   a first conductor layer that is disposed on the insulating layer and that is in contact with the laminated film;
   a first interlayer insulating layer disposed on the first conductor layer;
   a second conductor layer that is disposed on the first interlayer insulating layer and that is in contact with the laminated film;
   a first contact plug that is connected to the first conductor layer; and
   a second contact plug that is connected to the second conductor layer;
   wherein the first conductor layer comprises a first end portion that is bent upwardly in a direction perpendicular to a surface of the substrate;
   wherein the second conductor layer comprises a second end portion that is bent upwardly in the direction perpendicular to a surface of the substrate;
   wherein the first end portion comprises a first end face;
   wherein the second end portion comprises a second end face;
   wherein the first contact plug is disposed on the first end face; and
   wherein the second contact plug is disposed on the second end face.

2. The nonvolatile semiconductor storage apparatus according to claim 1, wherein the columnar semiconductor, the laminated film and the first conductor layer form a first memory cell that operates in a depression mode; and
   wherein the columnar semiconductor, the laminated film and the second conductor layer form a second memory cell that operates in the depression mode.

3. The nonvolatile semiconductor storage apparatus according to claim 2, wherein the first memory cell and the second memory cell form a memory string.

4. The nonvolatile semiconductor storage apparatus according to claim 1, wherein the first end face has a width that is equal to or larger than a thickness of the first conductor layer.

5. The nonvolatile semiconductor storage apparatus according to claim 1, wherein the second end face is disposed in the same plane as and the first end face.

6. The nonvolatile semiconductor storage apparatus according to claim 1, wherein the first conductor layer further comprise a first central portion where the first conductor layer is in contact with the laminated film; and
   wherein the first end portion is made of the same material as the first central layer.

7. The nonvolatile semiconductor storage apparatus according to claim 1, wherein the first end portion forms an angle that is equal to or larger than 45 degree with a surface of the substrate.

8. The nonvolatile semiconductor storage apparatus according to claim 6, wherein the insulating layer comprises:
   a concave portion that is in contact with the first central portion, and
   a convex portion that is in contact with the first end portion.

9. The nonvolatile semiconductor storage apparatus according to claim 1, wherein the first end portion has a straight shape.

10. The nonvolatile semiconductor storage apparatus according to claim 1, wherein the first end portion has a curved shape.

* * * * *